(12) United States Patent
Su et al.

(10) Patent No.: US 11,848,372 B2
(45) Date of Patent: Dec. 19, 2023

(54) METHOD AND STRUCTURE FOR REDUCING SOURCE/DRAIN CONTACT RESISTANCE AT WAFER BACKSIDE

(71) Applicant: Taiwan Semiconductor Manufacturing Co., Ltd., Hsin-Chu (TW)

(72) Inventors: Huan-Chieh Su, Changhua County (TW); Li-Zhen Yu, Hsinchu (TW); Chun-Yuan Chen, Hsinchu (TW); Cheng-Chi Chuang, New Taipei (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 339 days.

(21) Appl. No.: 17/236,675

(22) Filed: Apr. 21, 2021

(65) Prior Publication Data
US 2022/0344496 A1 Oct. 27, 2022

(51) Int. Cl.
*H01L 21/8234* (2006.01)
*H01L 29/66* (2006.01)
(Continued)

(52) U.S. Cl.
CPC ............ *H01L 29/66795* (2013.01); *H01L 21/823418* (2013.01); *H01L 21/823431* (2013.01);
(Continued)

(58) Field of Classification Search
None
See application file for complete search history.

(56) References Cited

U.S. PATENT DOCUMENTS 8,772,109 B2 7/2014 Colinge
8,785,285 B2 7/2014 Tsai et al.
(Continued)

FOREIGN PATENT DOCUMENTS

DE 112015006959 T5 6/2018
DE 102020103515 A1 9/2020

OTHER PUBLICATIONS

Lou, Qiaowei, et al., "Optical Emission Spectroscopic Studies and Comparisons of CH3F/CO2 and CH3F/O2 Inductively Coupled Plasmas", Plasma Processing Laboratory, Department of Chemical and Biomolecular Engineering, University of Houston, Manuscript # JVSTA-A-14-332.
(Continued)

*Primary Examiner* — Joseph C. Nicely
*Assistant Examiner* — Lamont B Koo
(74) *Attorney, Agent, or Firm* — HAYNES AND BOONE, LLP

(57) ABSTRACT

A method provides a structure having a fin oriented lengthwise and widthwise along first and second directions respectively, an isolation structure adjacent to sidewalls of the fin, and first and second source/drain (S/D) features over the fin. The method includes forming an etch mask exposing a first portion of the fin under the first S/D feature and covering a second portion of the fin under the second S/D feature; removing the first portion of the fin, resulting in a first trench; forming a first dielectric feature in the first trench; and removing the second portion of the fin to form a second trench. The first dielectric feature and the isolation structure form first and second sidewalls of the second trench respectively. The method includes laterally etching the second sidewalls, thereby expanding the second trench along the second direction and forming a via structure in the expanded second trench.

20 Claims, 17 Drawing Sheets

(51) Int. Cl.
  *H01L 29/78* (2006.01)
  *H01L 27/092* (2006.01)
  *H01L 29/06* (2006.01)
(52) U.S. Cl.
  CPC .. *H01L 21/823481* (2013.01); *H01L 27/0924* (2013.01); *H01L 29/0653* (2013.01); *H01L 29/7851* (2013.01)

(56) References Cited

U.S. PATENT DOCUMENTS

| | | | |
|---|---|---|---|
| 8,802,504 | B1 | 8/2014 | Hou et al. |
| 8,803,292 | B2 | 8/2014 | Chen et al. |
| 8,803,316 | B2 | 8/2014 | Lin et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 8,993,380 | B2 | 3/2015 | Hou et al. |
| 9,105,490 | B2 | 8/2015 | Wang et al. |
| 9,236,267 | B2 | 1/2016 | De et al. |
| 9,236,300 | B2 | 1/2016 | Liaw |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 9,520,482 | B1 | 12/2016 | Chang et al. |
| 9,576,814 | B2 | 2/2017 | Wu et al. |
| 9,704,835 | B2 | 7/2017 | Feng et al. |
| 9,711,555 | B2 | 7/2017 | Lin et al. |
| 9,818,872 | B2 | 11/2017 | Ching et al. |
| 9,887,269 | B2 | 2/2018 | Ching et al. |
| 9,899,398 | B1 | 2/2018 | Colinge et al. |
| 10,020,261 | B2 | 7/2018 | Wu et al. |
| 10,032,627 | B2 | 7/2018 | Lee et al. |
| 10,109,721 | B2 | 10/2018 | Lin et al. |
| 10,157,799 | B2 | 12/2018 | Ching et al. |
| 10,199,502 | B2 | 2/2019 | Huang et al. |
| 10,269,715 | B2 | 4/2019 | Wu et al. |
| 10,282,504 | B2 | 5/2019 | Wu et al. |
| 2014/0332749 | A1 | 11/2014 | Yokoyama |
| 2018/0175036 | A1 | 6/2018 | Ching et al. |

OTHER PUBLICATIONS

Michallet, Jean-Eric, et al. "CoolCube: A True 3DVLSI Alternative to Scaling", Mar. 24, 2015, 3DInCities. https://www.3dincites.com/2015/03/coolcube-a-true-3dvlsi-alternative-to-scaling/.

Chen, Hsin-Ping, et al., "Semiconductor Device with Conductors Embedded in a Substrate", U.S. Appl. No. 16/752,158, filed Jan. 24, 2020, Assignee: Taiwan Semiconductor Manufacturing Co., Ltd., 29 pages specification, 19 pages drawings.

Chen, Chun-Yuan, et al., "Semiconductor Devices with Backside Air Gap Dielectric", U.S. Appl. No. 16/888,217, filed May 29, 2020, Assignee: Taiwan Semiconductor Manufacturing Co., Ltd., 27 pages specification, 16 pages drawings.

Su, Huan-Chieh, et al., "Backside Power Rail and Methods of Forming the Same", U.S. Appl. No. 16/901,963, filed Jun. 15, 2020, Assignee: Taiwan Semiconductor Manufacturing Co., Ltd., 29 pages specification, 22 pages drawings.

Huang, Lin-Yu, et al., "Method for Forming Source/Drain Contacts Utilizing an Inhibitor", U.S. Appl. No. 16/881,481, filed May 22, 2020, Assignee: Taiwan Semiconductor Manufacturing Co., Ltd., 27 pages specification, 16 pages drawings.

Huang, Lin-Yu, et al., "Dumbbell Shaped Self-Aligned Capping Layer Over Source/Drain Contacts and Method Thereof", U.S. Appl. No. 16/901,572, filed Jun. 15, 2020, Assignee: Taiwan Semiconductor Manufacturing Co., Ltd., 33 pages specification, 21 pages drawings.

Chen, Chun-Yuan, et al., "Anchor-Shaped Backside via and Method Thereof", U.S. Appl. No. 16/926,447, filed Jul. 10, 2020, Assignee: Taiwan Semiconductor Manufacturing Co., Ltd., 32 pages specification, 16 pages drawings.

Kuo-Cheng Chiang, et al., "Semiconductor Devices with Backside Power Rail And Backside Self-Aligned via" U.S. Appl. No. 17/080,521, filed Oct. 26, 2020, Assignee: Taiwan Semiconductor Manufacturing Co., Ltd., 37 pages specification, 24 pages drawings.

Lin-Yu Huang, et al., "Selective Liner on Backside via and Method Thereof" U.S. Appl. No. 16/944,263, filed Jul. 31, 2020, Assignee: Taiwan Semiconductor Manufacturing Co., Ltd., 30 pages specification, 36 pages drawings.

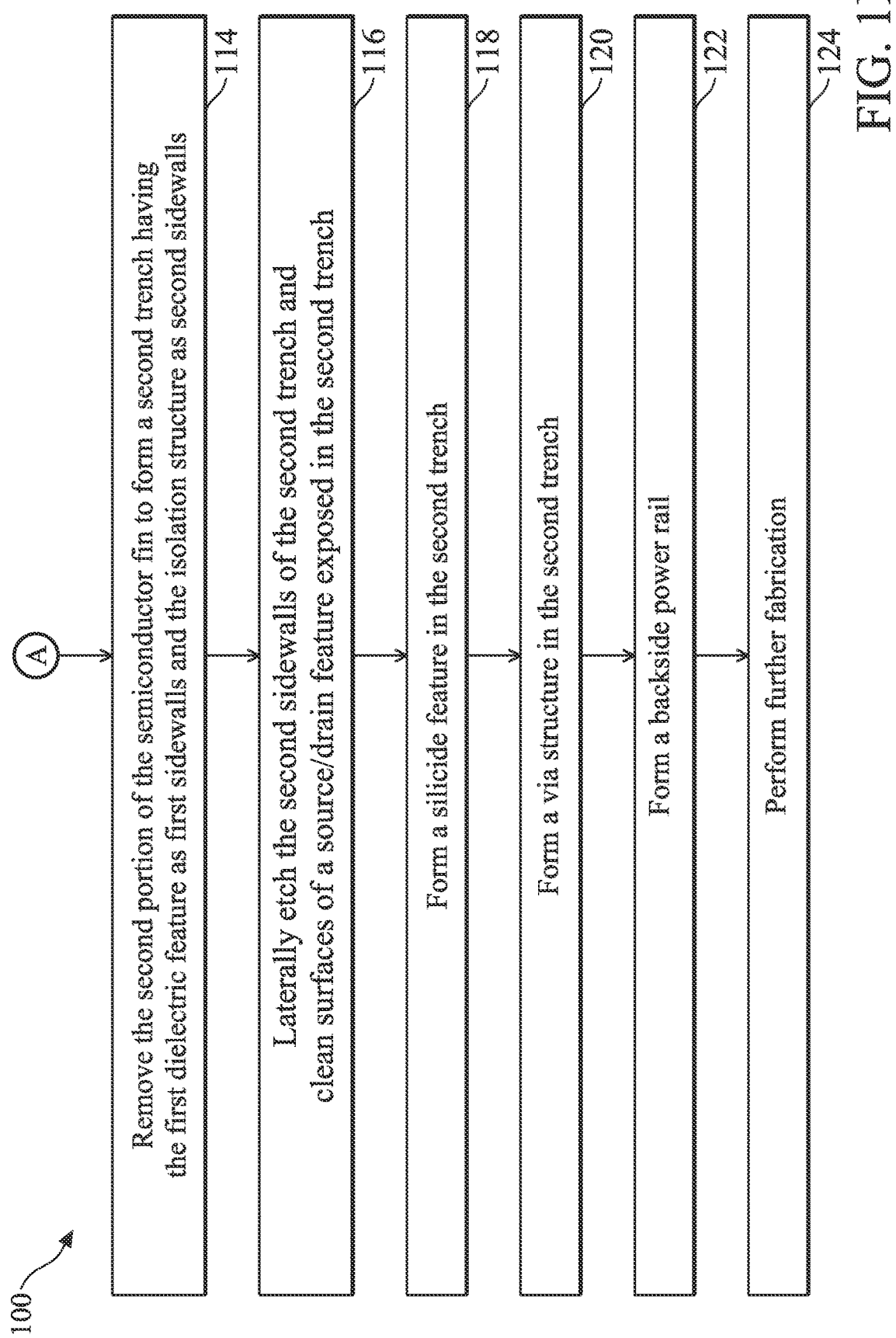

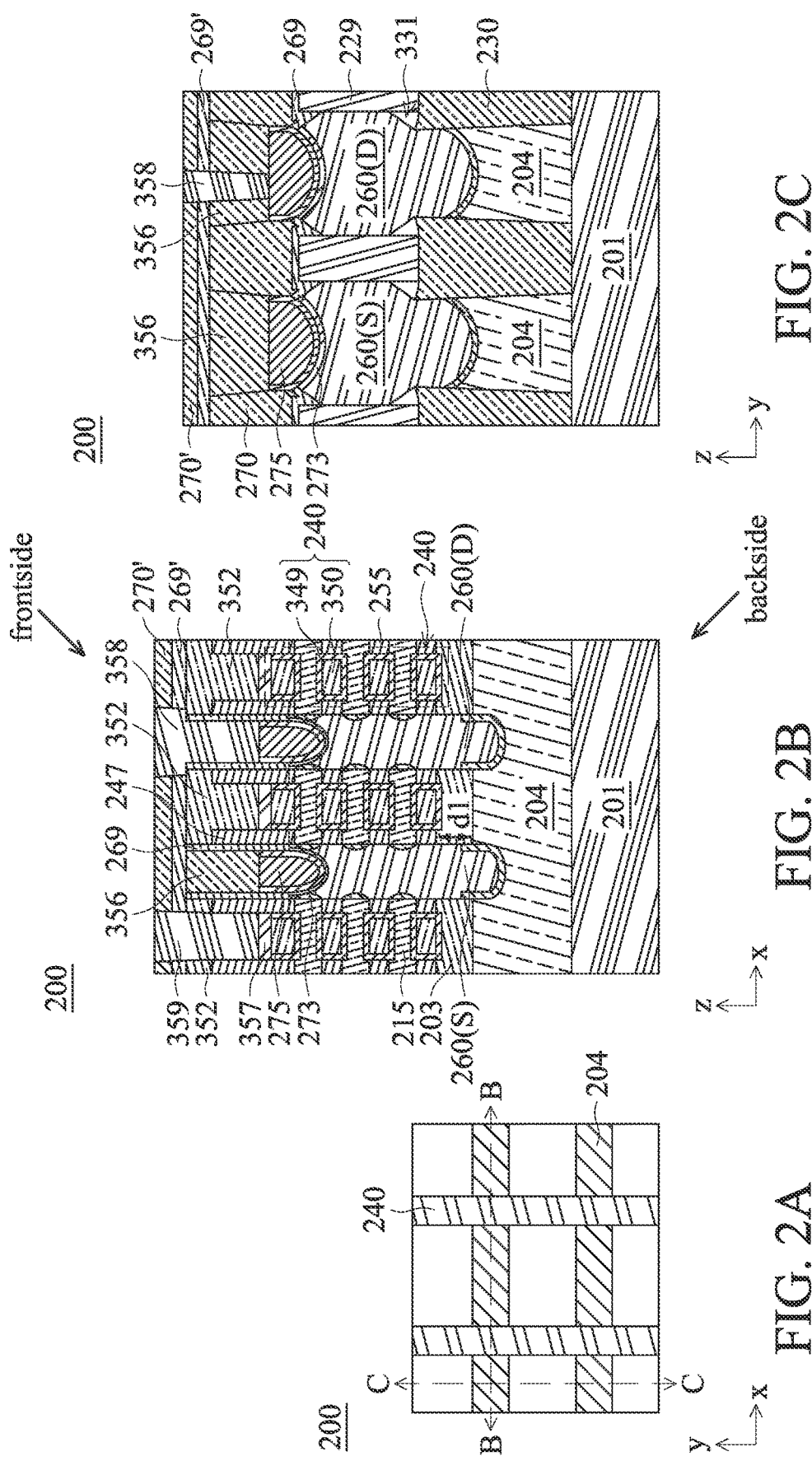

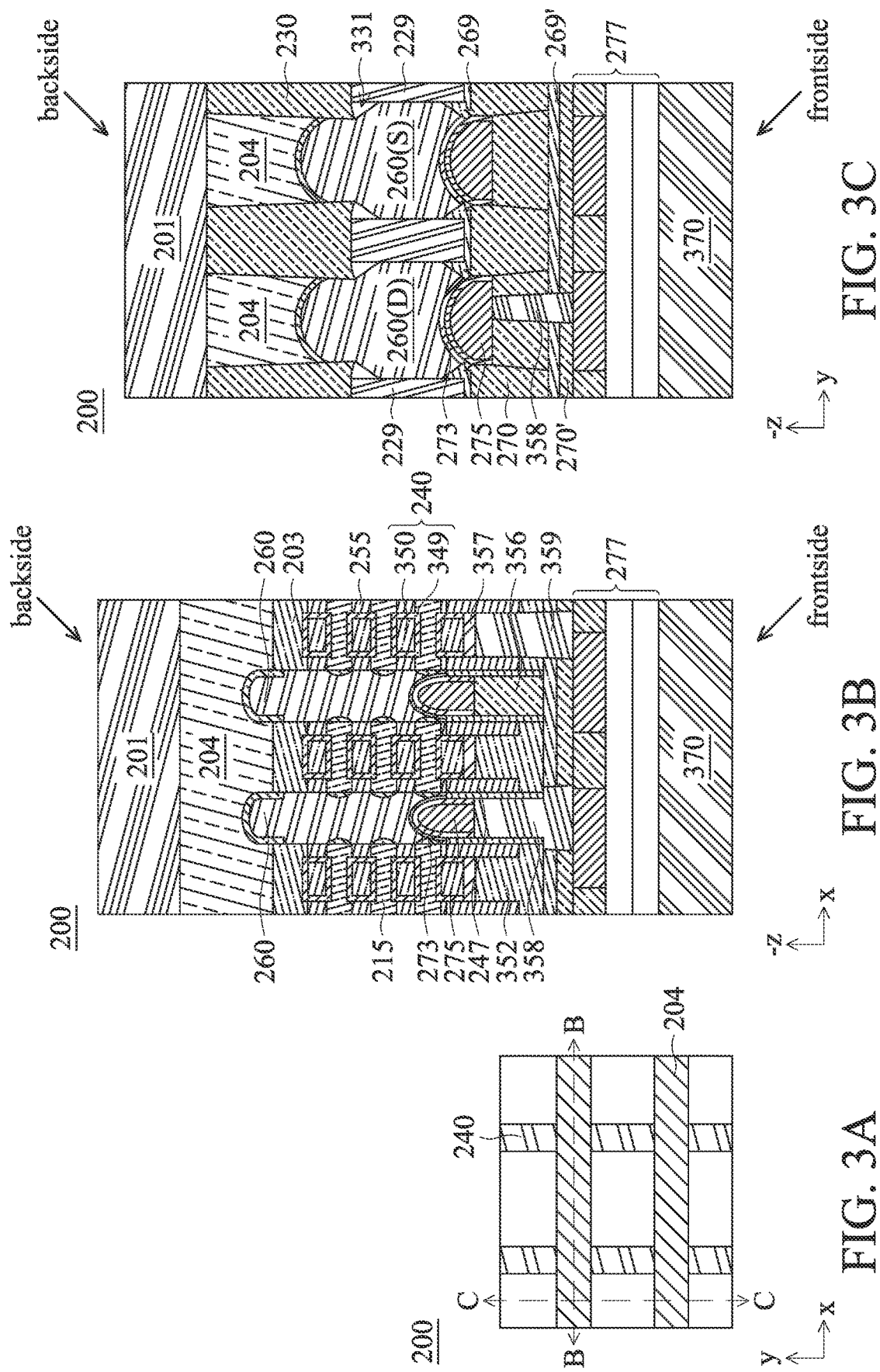

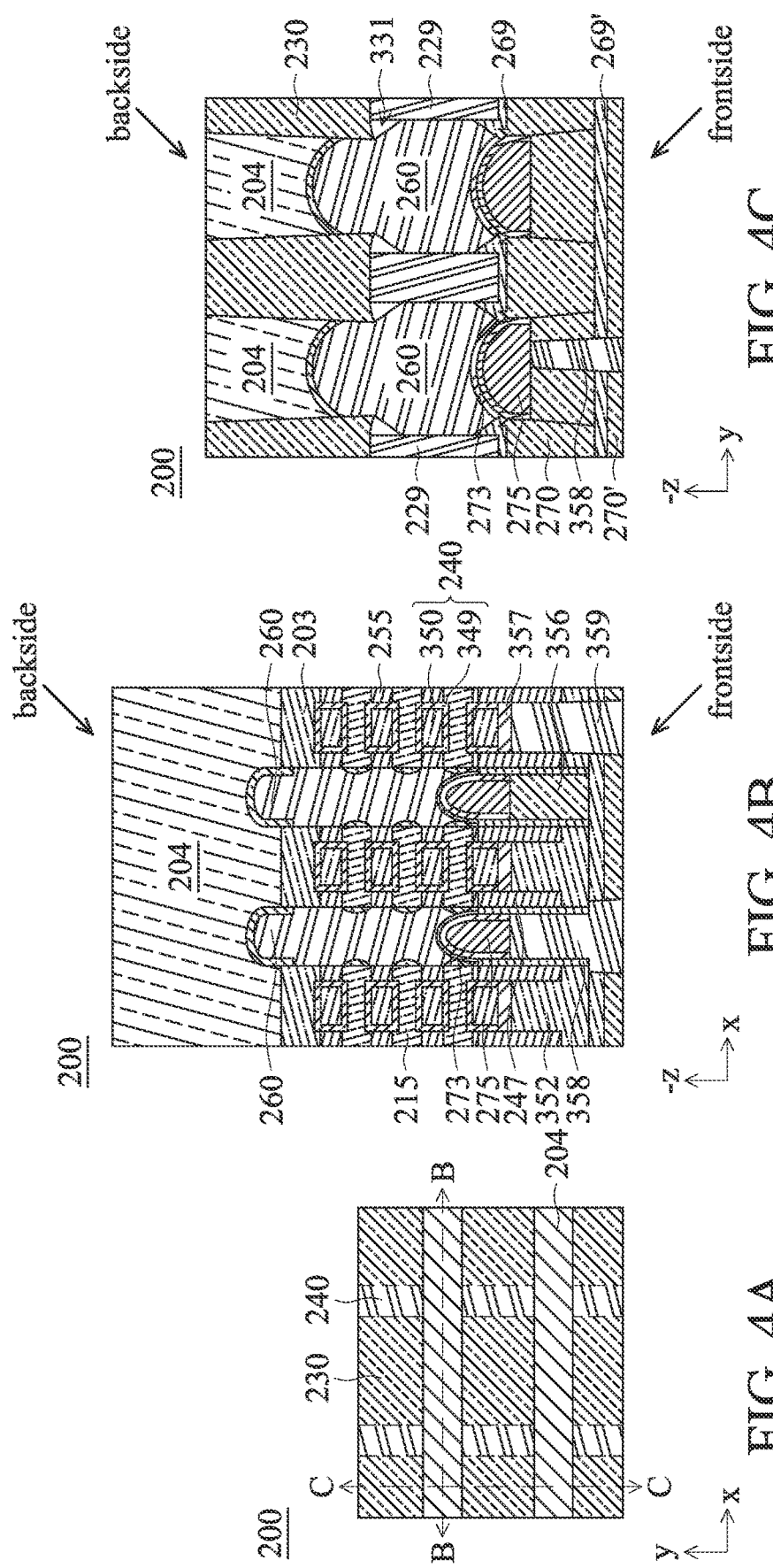

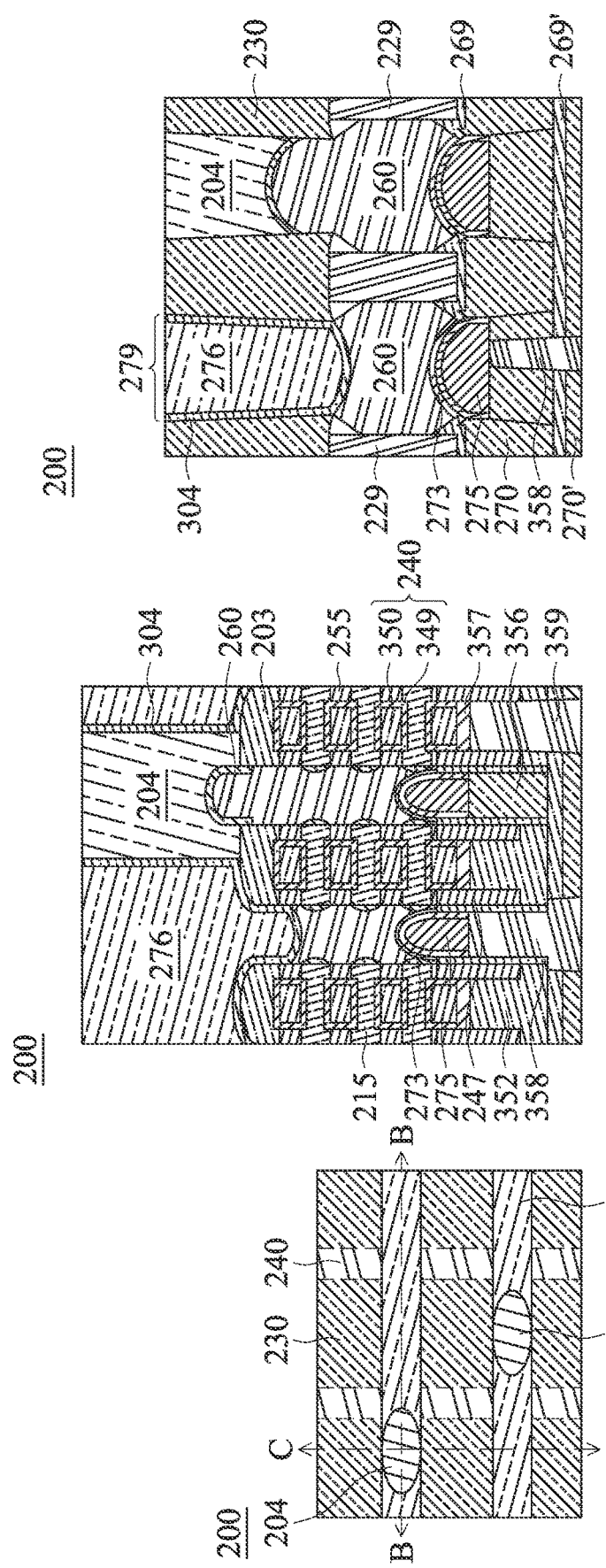

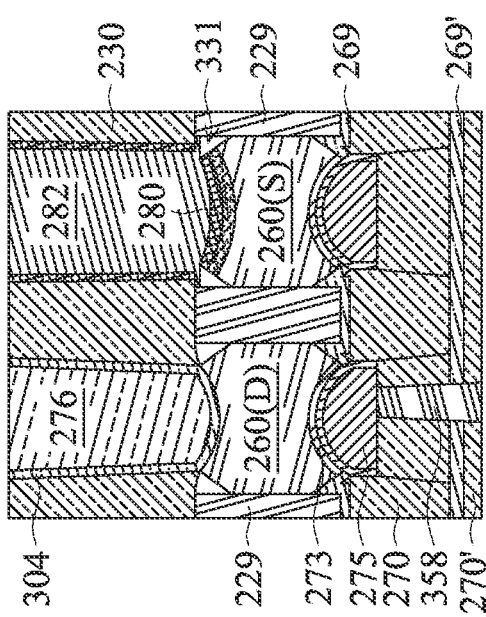

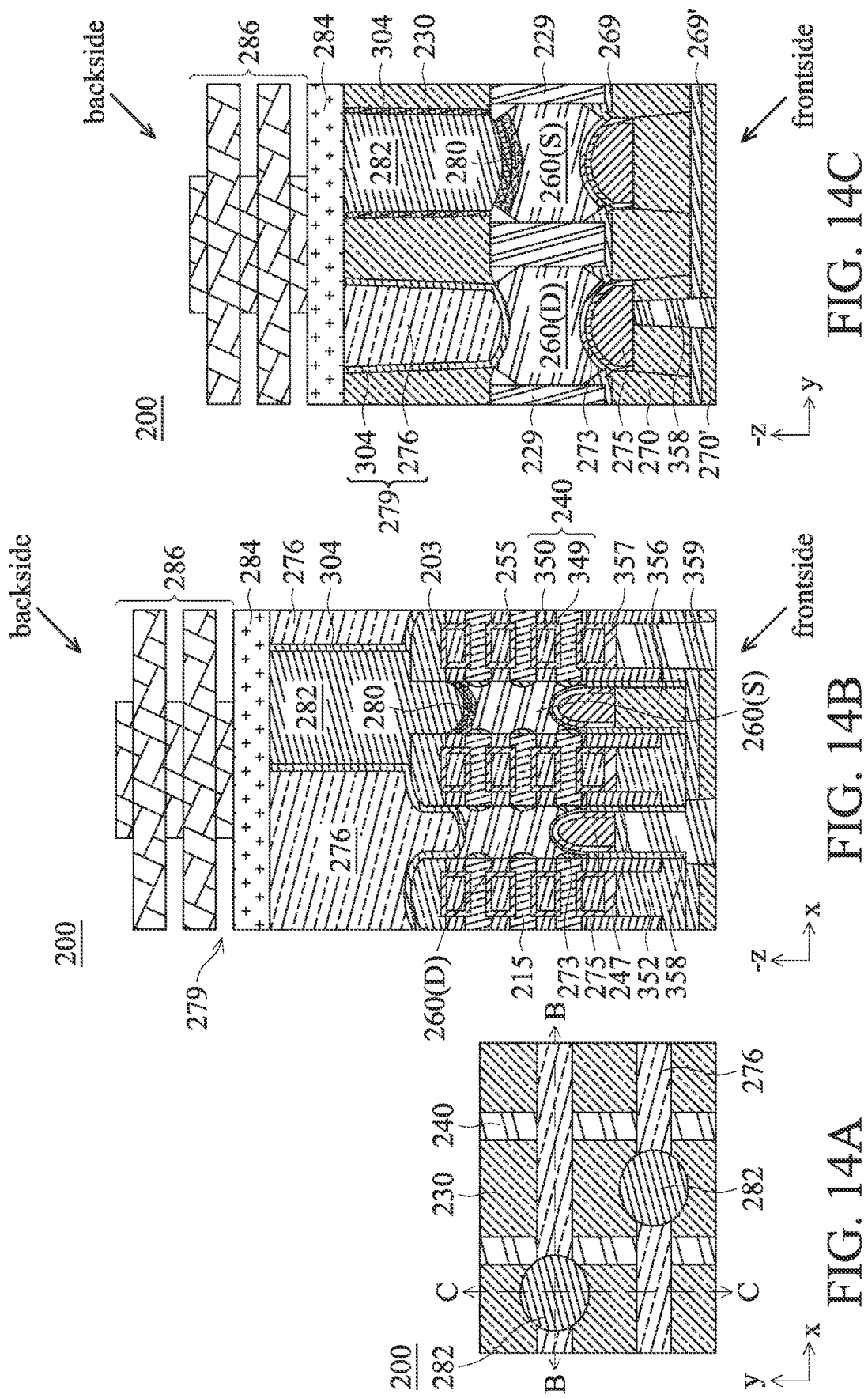

METHOD AND STRUCTURE FOR REDUCING SOURCE/DRAIN CONTACT RESISTANCE AT WAFER BACKSIDE

BACKGROUND

Conventionally, integrated circuits (IC) are built in a stacked-up fashion, having transistors at the lowest level and interconnect (vias and wires) on top of the transistors to provide connectivity to the transistors. Power rails (such as metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits. Therefore, although existing approaches in semiconductor fabrication have been generally adequate for their intended purposes, they have not been entirely satisfactory in all respects. One area of interest is how to form power rails and vias on the backside of an IC with reduced resistance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B show a flow chart of a method of forming a semiconductor device with backside power rails and backside vias, according to various aspects of the present disclosure.

FIGS. 2A, 3A, 4A, 5A, 6A, 7A, 8A, 9A, 10A, 11A, 12A, 13A, and 14A illustrate top views of a portion of a semiconductor device, according to some embodiments.

FIGS. 2B, 3B, 4B, 5B, 6B, 7B, 8B, 9B, 10B, 11B, 12B, 13B, and 14B illustrate cross-sectional views of a portion of the semiconductor device along the B-B line in FIGS. 2A, 3A, 4A, 5A, 6A, 7A, 8A, 9A, 10A, 11A, 12A, 13A, and 14A, respectively, according to some embodiments.

FIGS. 2C, 3C, 4C, 5C, 6C, 7C, 8C, 9C, 10C, 11C, 11C-1, 12C, 12C-1, 12C-2, 13C, and 14C illustrate cross-sectional views of a portion of the semiconductor device along the C-C line in FIGS. 2A, 3A, 4A, 5A, 6A, 7A, 8A, 9A, 10A, 11A, 12A, 13A, and 14A, respectively, according to some embodiments.

DETAILED DESCRIPTION

Figure 1A:
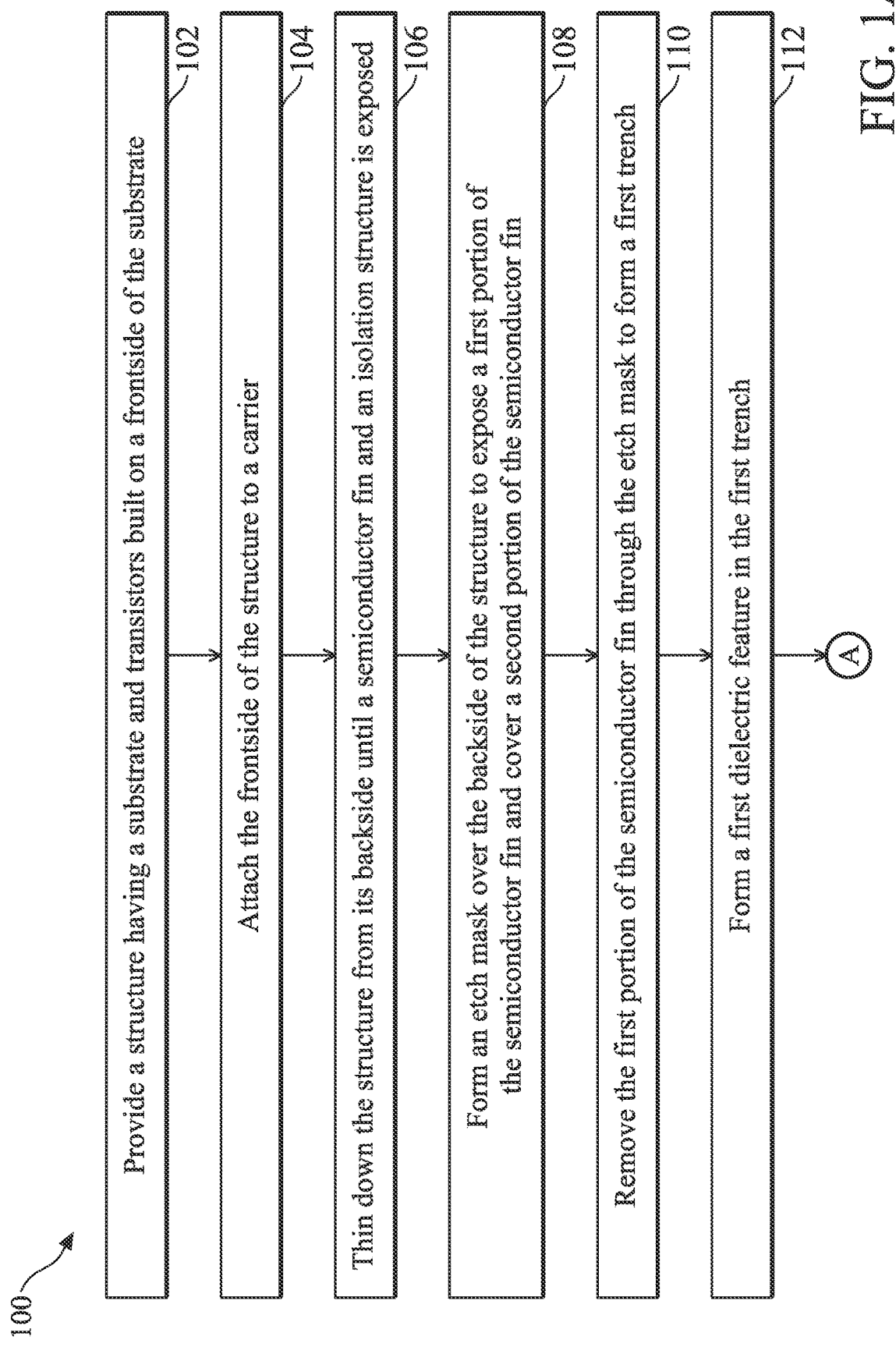

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor devices with backside power rails and backside vias. As discussed above, power rails in IC need further improvement in order to provide the needed performance boost as well as reducing power consumption. An object of the present disclosure includes providing power rails (or power routings) on a back side (or backside) of a structure containing transistors (such as gate-all-around (GAA) transistors and/or FinFET transistors) in addition to an interconnect structure (which may include power rails as well) on a front side (or frontside) of the structure. This increases the number of metal tracks available in the structure for directly connecting to source/drain contacts and vias. It also increases the gate density for greater device integration than existing structures without the backside power rails. The backside power rails may have wider dimension than the first level metal (M0) tracks on the frontside of the structure, which beneficially reduces the power rail resistance. The present disclosure also provides a backside via structure for connecting the backside power rails to S/D features on the frontside. In some approaches, backside vias are slim and tall because their profile resembles that of a semiconductor fin. The backside via structure according to the present disclosure has an expanded dimension along a direction parallel to a metal gate and perpendicular to a transistor channel (i.e., along a widthwise of a semiconductor fin). This increases the volume of the backside via for a reduced via resistance. The backside via structure according to the present disclosure does not have a dielectric liner (such as a silicon nitride liner) like in other vias. This further increases the volume of the backside via. In some embodiments, the volume of the backside via of the present disclosure and the interfacial area between the backside via and the frontside S/D feature may gain about 10% to 20% compared to other via structures. The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. The present disclosure can also be utilized to make FinFET devices having backside power rail and backside self-aligned vias. For the purposes of simplicity, the present disclosure uses GAA devices as an example, and points out certain differences in the processes between GAA and FinFET embodiments. Those of ordinary skill in the art should appreciate that they may readily use the present disclosure as a basis for designing or modifying other processes and structures for carrying out the same purposes and/or achieving the same advantages of the embodiments introduced herein.

FIGS. 1A and 1B are a flow chart of a method 100 for fabricating a semiconductor device according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2A through FIG. 11C that illustrate various top, cross-sectional, and perspective views of a semiconductor device (or a semiconductor structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LD-MOS) transistors, high voltage transistors, high frequency transistors, memory devices, other suitable components, or combinations thereof. FIGS. 2A through 13E have been simplified for the sake of clarity to better understand the inventive concepts of the present disclosure. Additional features can be added in the device 200, and some of the features described below can be replaced, modified, or eliminated in other embodiments of the device 200.

At operation 102, the method 100 (FIG. 1A) provides semiconductor device 200 having a substrate 201 and transistors built on a frontside of the substrate 201. FIG. 2A illustrates a top view of the device 200, and FIGS. 2B and 2C illustrate cross-sectional views of the device 200, in portion, along the B-B line and the C-C line in FIG. 2A, respectively. Particularly, the B-B line is cut along the lengthwise direction of a semiconductor fin 204 (direction "X") and the C-C line is cut into the source/drain regions of the transistors and is parallel to the lengthwise direction of gate stacks 240 (direction "Y"). The lengthwise directions of the gate stacks 240 and the semiconductor fins 204 are perpendicular to each other. The B-B lines and C-C lines in FIGS. 3A through 14A are similarly configured.

Referring to FIGS. 2A-2C, the semiconductor device 200 includes the substrate 201 and various elements built on the front surface of the substrate 201. In the depicted embodiment, the semiconductor device 200 includes isolation features 230 (or isolation structure 230) over the substrate 201, semiconductor fins 204 extending from the substrate 201 and adjacent to the isolation features 230, and source/drain (S/D) features 260 over the semiconductor fins 204 in the S/D regions. The semiconductor device 200 further includes dielectric fins 229 over the isolation features 230 and running parallel to the semiconductor fins 204. The sidewalls of the S/D features 260 are confined by adjacent dielectric fins 229. In the depicted embodiment, the semiconductor device 200 includes voids (air gaps) 331 that are surrounded by the S/D features 260, the dielectric fins 229, and the isolation structure 230.

The semiconductor device 200 further includes one or more channel semiconductor layers 215 suspended over the semiconductor fins 204 and connecting the S/D features 260 along the "X" direction, gate stacks 240 between the S/D features 260 and wrapping around each of the channel layers 215, and a bottom dielectric capping (or blocking) layer 203 disposed between the semiconductor fins 204 and both the channel layers 215 and the gate stacks 240. The semiconductor device 200 further includes inner spacers 255 between the S/D features 260 and the gate stack 240, and a gate spacer (or outer gate spacer) 247 over sidewalls of the gate stack 240 and over the topmost channel layer 215. In an embodiment where the device 200 is a FinFET device, the channel layers 215 are merged into one channel layer (a semiconductor fin channel), and the inner spacers 255 are omitted. Further, in such FinFET embodiment, the gate stack 240 engages top and sidewalls of the semiconductor fin channel, and in the cross-sectional view of FIG. 2B, the gate stack 240 would be on top of the semiconductor fin channel only.

In the depicted embodiment, the semiconductor device 200 further includes a contact etch stop layer (CESL) 269 adjacent to the gate spacer 247 and over the epitaxial S/D features 260 and the isolation features 230, an inter-layer dielectric (ILD) layer 270 over the CESL 269, another CESL 269' over the ILD 270, and another ILD 270' over the CESL 269'. Over the gate stack 240, the semiconductor device 200 further includes a self-aligned capping layer 352. In some implementations (like depicted in FIG. 2B), a glue layer 357 may be deposited over the gate stacks 240 and to improve adhesion between the gate stacks 240 and the gate vias 359 and to reduce contact resistance thereof. Over the S/D features 260, the semiconductor device 200 further includes silicide features 273, S/D contacts 275, dielectric S/D capping layer 356, and S/D contact via 358. In the depicted embodiment, the dielectric S/D capping layer 356 is disposed over the source feature 260 (labeled as "260(S)" in FIGS. 2B-2C), and the S/D contact via 358 is disposed over the drain feature 260 (labeled as "260(D)" in FIGS. 2B-2C). In alternative embodiments, the S/D capping layer 356 may be disposed over the drain feature 260, and the S/D contact via 358 may be disposed over the source feature 260. In some embodiments, the S/D capping layer 356 may be disposed over both the source and the drain features 260. In some embodiments the S/D contact vias 358 may be disposed over both the source and the drain features 260.

Referring to FIGS. 3A, 3B, and 3C, in which the semiconductor device 200 is flipped upside down, the semiconductor device 200 further includes one or more interconnect layers (denoted with 277) with wires and vias embedded in dielectric layers. The one or more interconnect layers connecting gate, source, and drain electrodes of various transistors, as well as other circuits in the device 200, to form an integrated circuit in part or in whole. The semiconductor device 200 may further include passivation layers, adhesion layers, and/or other layers built on the frontside of the semiconductor device 200. These layers and the one or more interconnect layers are collectively denoted with the label 277. The various elements of the semiconductor device 200 are further described below.

In an embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate.

In some embodiments, the semiconductor fins 204 include silicon, silicon germanium, germanium, or other suitable semiconductor, and may be undoped, unintentionally doped, or slightly doped with n-type or p-type dopants. The fins 204 may be patterned by any suitable method. For example, the fins 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 204. For example, the masking element may be used for etching recesses into semiconductor layers over or in the substrate 201, leaving the fins 204 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 204 may be suitable.

The isolation features 230 may include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures and/or deep trench isolation (DTI) structures. In an embodiment, the isolation features 230 can be formed by filling the trenches between fins 204 with insulator material (for example, by using a CVD process or a spin-on glass process), performing a chemical mechanical polishing (CMP) process to remove excessive insulator material and/or planarize a top surface of the insulator material layer, and etching back the insulator material layer to form isolation features 230.

The dielectric fins 229 may include multiple layers of dielectric materials. For example, each dielectric fin 229 may include a dielectric liner as an outer layer and a dielectric fill layer as an inner layer. For example, the dielectric liner includes a low-k dielectric material (for example, k<7) such as a dielectric material including Si, O, N, and C (such as SiCN, SiOC, and SiOCN). Exemplary low-k dielectric materials include fluoride-doped silica glass (FSG), carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, or combinations thereof. The dielectric liner may be deposited using CVD, PVD, ALD, HDPCVD, MOCVD, RPCVD, PECVD, LPCVD, ALCVD, APCVD, other suitable methods, or combinations thereof. For example, the dielectric fill layer includes silicon oxide, silicon nitride, silicon oxynitride, TEOS formed oxide, PSG, BPSG, low-k dielectric material, other suitable dielectric material, or combinations thereof. The dielectric fill layer may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer may be deposited using other types of methods. In some embodiments, the dielectric fins 229 may further include a high-k helmet layer (for example, k>7) disposed over both the dielectric liner and the dielectric fill layer. In this way, the dielectric fill layer is fully surrounded by the dielectric liner at bottom and sidewalls and by the high-k helmet layer at top. The high-k helmet layer may include $La_2O_3$, $Al_2O_3$, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s).

The S/D features 260 include epitaxially grown semiconductor materials such as epitaxially grown silicon, germanium, or silicon germanium. The S/D features 260 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D features 260 may be doped with n-type dopants and/or p-type dopants. In some embodiments, for n-type transistors, the S/D features 260 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the S/D features 260 include silicon germanium or germanium, and can be doped with boron, other p-type dopant, or combinations thereof (for example, forming Si:Ge:B epitaxial S/D features). The S/D features 260 may include multiple epitaxial semiconductor layers having different levels of dopant density. In some embodiments, annealing processes (e.g., rapid thermal annealing (RTA) and/or laser annealing) are performed to activate dopants in the epitaxial S/D features 260.

In embodiments, the channel layers 215 includes a semiconductor material suitable for transistor channels, such as silicon, silicon germanium, or other semiconductor material(s). The channel layers 215 may be in the shape of rods, bars, sheets, or other shapes in various embodiments. In an embodiment, the channel layers 215 are initially part of a stack of semiconductor layers that include the channel layers 215 and other (sacrificial) semiconductor layers alternately stacked layer-by-layer. The sacrificial semiconductor layers and the channel layers 215 include different material compositions (such as different semiconductor materials, different constituent atomic percentages, and/or different constituent weight percentages) to achieve etching selectivity. During a gate replacement process to form the gate stack 240, the sacrificial semiconductor layers are removed, leaving the channel layers 215 suspended over the semiconductor fins 204. In some embodiments, the device 200 may include 3 to 8 channel layers 215, for example.

In some embodiments, the inner spacer layer 255 includes a low-k dielectric material (for example, k<7) that includes silicon, oxygen, carbon, nitrogen, other suitable material, or combinations thereof (for example, silicon oxide, silicon nitride, silicon oxynitride, silicon carbide, or silicon oxycarbonitride). The inner spacer layer 255 may be formed by deposition and etching processes. For example, after S/D trenches are etched and before the S/D features 260 are epitaxially grown from the S/D trenches, an etch process may be used to recess the sacrificial semiconductor layers between the adjacent channel layers 215 to form gaps vertically between the adjacent channel layers 215. Then, one or more dielectric materials are deposited (using CVD or ALD for example) to fill the gaps. Another etching process is performed to remove the dielectric materials outside the gaps, thereby forming the inner spacer layer 255.

In some embodiments, the dielectric blocking layer (or bottom dielectric capping layer) 203 includes a low-k dielectric material (for example, k<7) such as a dielectric material including Si, O, N, and C, other suitable material, or combinations thereof (for example, silicon oxide, silicon nitride, silicon oxynitride, silicon carbide, silicon carbon nitride, silicon oxycarbide, or silicon oxycarbonitride). In some embodiment, the dielectric blocking layer 203 may include a high-k material (for example, k>7) such as $La_2O_3$, $Al_2O_3$, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). The dielectric blocking layer 203 may be deposited using CVD, ALD, PVD, or oxidation. In an embodiment, the dielectric blocking layer 203 is initially deposited on the semiconductor fin 204 and is patterned using the same process that patterns the semiconductor fin 204. In another embodiment, a sacrificial semiconductor layer (such as SiGe) is initially deposited on the semiconductor fin 204 and is patterned using the same process that patterns the semiconductor fin 204. The sacrificial layer is removed and replaced with the dielectric blocking layer 203 during a gate replacement process that forms the gate stack 240. The dielectric blocking layer 203 serves to isolate the channel layers 215 and the gate stack 240 from the backside vias to be formed in subsequent processes. In some embodiments, the dielectric blocking layer 203 may have a thickness d1 in a range of 5 nm to about 30 nm. In some embodiment, if the dielectric blocking layer 203 is too thin (such as less than 5 nm), then it may not provide sufficient isolation to the channel layers 215 and the gate stack 240. In some embodiment, if the dielectric blocking layer 203 is too thick (such as more than 30 nm), then the backside vias would be long and the resistance thereof would be high, which will be further discussed later.

In the depicted embodiment, each gate stack 240 includes a gate dielectric layer 349 and a gate electrode 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$) alloy, other suitable high-k dielectric material, or combinations thereof. The gate dielectric layer 349 may be formed by chemical oxidation, thermal oxidation, atomic layer deposition (ALD), chemical vapor deposition (CVD), and/or other suitable methods. In some embodiments, the gate stack 240 further includes an interfacial layer between the gate dielectric layer 349 and the channel layers 215. The interfacial layer may include silicon dioxide, silicon oxynitride, or other suitable materials. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240 includes a high-k dielectric layer and metal layer(s), it is also referred to as a high-k metal gate.

In an embodiment, the gate spacer 247 includes a dielectric material such as a dielectric material including silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In embodiments, the gate spacer 247 may include $La_2O_3$, $Al_2O_3$, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). For example, a dielectric layer including silicon and nitrogen, such as a silicon nitride layer, can be deposited over a dummy gate stack (which is subsequently replaced by the high-k metal gate 240) and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate stack 240. In embodiments, the gate spacer 247 may have a thickness of about 1 nm to about 40 nm, for example.

In some embodiments, the SAC layer 352 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The SAC layer 352 protects the gate stacks 240 from etching and CMP processes that are used for etching S/D contact holes. The SAC layer 352 may be formed by recessing the gate stacks 240 and optionally recessing the gate spacers 247, depositing one or more dielectric materials over the recessed gate stacks 240 and optionally over the recessed gate spacers 247, and performing a CMP process to the one or more dielectric materials. In some embodiments, the SAC layer 352 may have a thickness of 0 nm (not existent) to about 50 nm.

In embodiments, the CESLs 269 and 269' may each include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s); and may be formed by CVD, PVD, ALD, or other suitable methods. The ILD layers 270 and 270' may each comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layers 270 and 270' may each be formed by PECVD (plasma enhanced CVD), FCVD (flowable CVD), or other suitable methods.

In some embodiments, the silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

In an embodiment, the S/D contacts 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contacts 275. In some embodiments, the S/D contacts 275 may have a thickness in a range of about 1 nm to about 50 nm, for example.

In some embodiments, the capping layer 356 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The capping layer 356 protects the S/D contacts 275 from etching and CMP processes and isolating the S/D contacts 275 from the interconnect structure formed thereon. In some embodiments, the SAC layer 352 and the capping layer 356 include different materials to achieve etch selectivity, for example, during the formation of the capping layer 356. In some alternative embodiments, the device 200 includes the SAC layer 352, but not the capping layer 356. In some other alternative embodiments, the device 200 includes the capping layer 356, but not the SAC layer 352. In some embodiments, the capping layer 356 may have a thickness of 0 nm (not existent) to about 50 nm, for example.

In an embodiment, the S/D contact vias 358 and the gate vias 359 may each include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contact vias 358 and/or the gate vias 359. In some embodiments, the glue layer 357 may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD. In some embodiments, the vias 358 and 359 may each have a thickness in a range of about 1 nm to about 50 nm, for example.

At operation 104, the method 100 (FIG. 1A) flips the device 200 upside down and attaches the frontside of the device 200 to a carrier 370, such as shown in FIGS. 3B and 3C. This makes the device 200 accessible from its backside for further processing. The operation 104 may use any suitable attaching processes, such as direct bonding, hybrid bonding, using adhesive, or other bonding methods. The operation 104 may further include alignment, annealing, and/or other processes. The carrier 370 may be a silicon wafer in some embodiment. In FIGS. 2A-14C, the "z" direction points from the backside of the device 200 to the frontside of the device 200, while the "-z" direction points from the frontside of the device 200 to the backside of the device 200.

At operation 106, the method 100 (FIG. 1A) thins down the device 200 from its backside until the semiconductor fins 204 and the isolation features 230 are exposed from the backside of the device 200. The resultant structure is shown in FIGS. 4A-4C according to an embodiment. For simplicity, FIGS. 4B through 14C omit some features that are already shown in FIGS. 3B-3C, particularly the layer 277 and the carrier 370. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

Figures 5A, 5B, 5C:
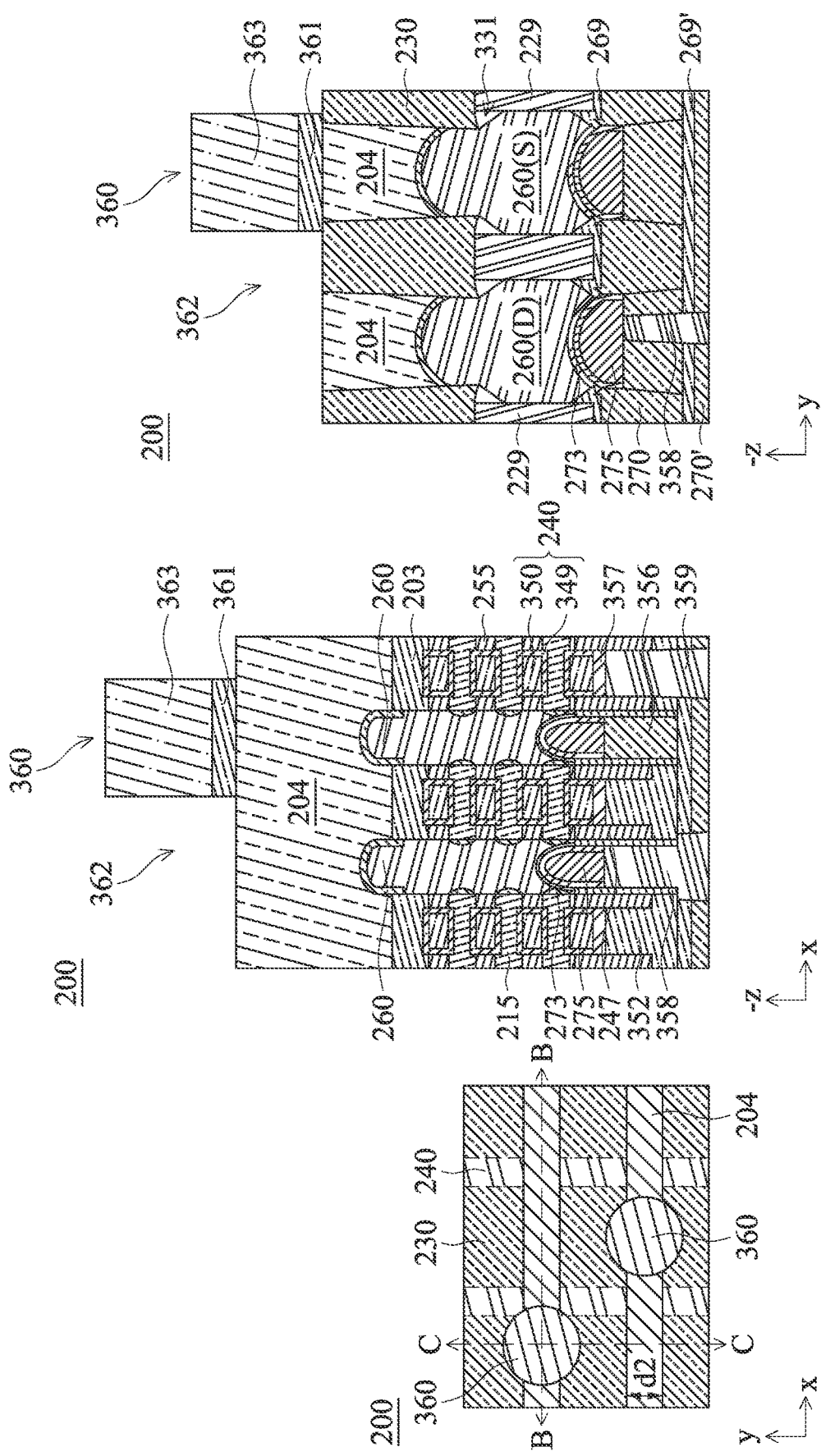

At operation 108, the method 100 (FIG. 1A) forms a patterned etch mask 360 over the backside of the device 200. The etch mask 360 covers the area under the S/D features 260 that are to be connected to backside vias and exposes the other area with openings 362. The resultant structure is shown in FIGS. 5A-5C according to an embodiment. In the depicted embodiment, the etch mask 360 covers the backside of source features (such as 260(S)) and exposes the backside of drain features (such as 260(D)). In some alternative embodiments, the etch mask 360 covers the backside of drain features (such as 260(D)) and exposes the backside of source features (such as 260(S)). In some other alternative embodiments, the etch mask 360 covers the backside of some of the source features and drain features and exposes other source features and drain features. In various embodiments, the etch mask 360 may be in any suitable size and any suitable shape such as oval, round, rectangular, square, or other shapes. The area of the semiconductor fins 204 that are covered by the etch mask 360 correspond to the backside vias (such as the vias 282 in FIGS. 12A-12C) to be formed, but may not have the same shape and size as the backside vias, as will be discussed. The etch mask 360 includes a material that is different than a material of the semiconductor fins 204 to achieve etching selectivity. In the depicted embodiment, the etch mask 360 includes a patterned resist 363 over a patterned hard mask 361 (such as a patterned mask having silicon nitride). In some embodiments, the etch mask 360 further includes an anti-reflective coating (ARC) layer or other layer(s) between the patterned resist 363 and the hard mask 361. The present disclosure contemplates other materials for the etch mask 360, so long as etching selectivity is achieved during the etching of the semiconductor fins 204. In some embodiments, after depositing a hard mask layer (e.g., a silicon nitride layer) over the backside of the device 200 (for example, using CVD, ALD, PVD, or other methods), operation 108 performs a lithography process that includes forming a resist layer over the hard mask layer (e.g., by spin coating), performing a pre-exposure baking process, performing an exposure process using a mask, performing a post-exposure baking process, and performing a developing process. During the exposure process, the resist layer is exposed to radiation energy (e.g., UV light, DUV light, or EUV light), where the mask blocks, transmits, and/or reflects radiation to the resist layer depending on a mask pattern of the mask and/or mask type (e.g., binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the resist layer is patterned into the resist pattern 363 that corresponds with the mask. Alternatively, the exposure process can be implemented or replaced by other methods, such as maskless lithography, e-beam writing, ion-beam writing, or combinations thereof. The hard mask layer is then etched through the patterned resist 363 to result in the patterned hard mask 361.

Figures 6A, 6B, 6C:
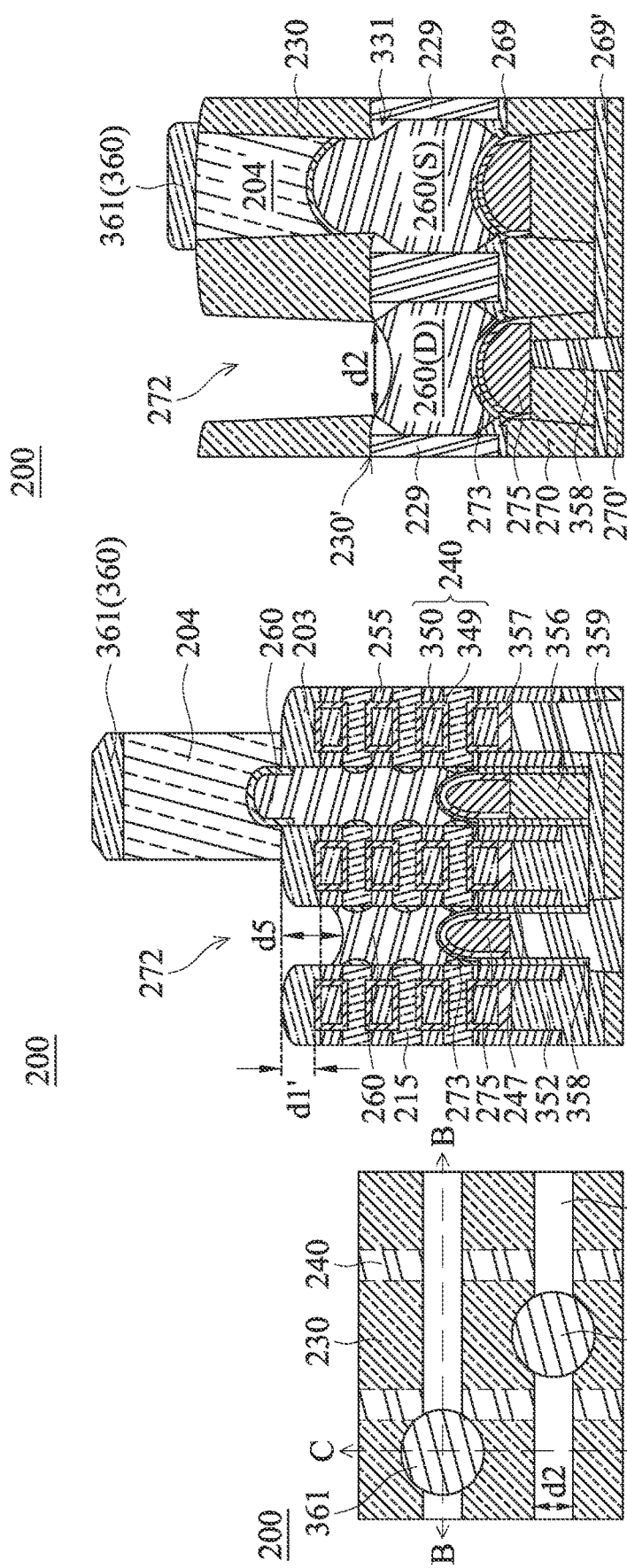

At operation 110, the method 100 (FIG. 1A) selectively etches the semiconductor fins 204 through the etch mask 360 to form trenches 272 over the backside of the gate stacks 240. A resultant structure of the device 200 is shown in FIGS. 6A-6C according to an embodiment. The trench 272 has a width d2 along the "y" direction at the top surface 230' of the isolation structure 230. The top surface 230' of the isolation structure 230 is also the interface between the isolation structure 230 and the dielectric fins 229. The patterned resist 363 is removed during the etching process or after the etching process completes. The patterned hard mask 361 may be partially consumed during the etching process. In the present embodiment, the operation 110 applies an etching process that is tuned to be selective to the materials of the semiconductor fins 204 and with no (or minimal) etching to the isolation features 230 and the inner spacers 255. In some embodiment, the etching process is further tuned to minimize etching to the blocking layer 203. In the present embodiment, the operation 110 applies an anisotropic (vertical) etching process to remove the exposed portion of the semiconductor fin 204. Using anisotropic etching helps to maintain the shape and size of the portion of the semiconductor fin 204 covered by the etch mask 360, which corresponds to the shape and size of backside vias to be formed in later steps. If the etching is isotropic, some portions of the semiconductor fin 204 covered by the mask 360/361 might be etched as well, which would in turn degrade the backside via structures in some instances. In the present embodiment, the blocking layer 203 could be partially consumed by the anisotropic etching and its thickness d1' may be slightly less than its original thickness d1 (FIG. 2B). Also, in the present embodiment, the width d2 is approximately equal to the original width of the semiconductor fin 204 (when measured at the same location) before etching because the etching can be tuned selective to the materials of the fin 204 and not the material of the isolation structure 230. The width d2 may be in a range of about 6 nm to about 40 nm in various embodiments. In various embodiments, the blocking layer 203 and the inner spacers 255 protect the gate stacks 240 from the etching process(es) of the operation 110. The etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

In the depicted embodiment, the drain feature 260(D) is also partially recessed to a level that is even with or slightly below the top surface 230' of the isolation structure 230. In various embodiments, the drain feature 260(D) is recessed such that its bottom (or backside) surface is below the bottom (or backside) surface of the blocking layer 203 by a distance d5 when the device 200 is viewed upside down such as in FIG. 6B. The distance d5 may be in a range of 0 nm to about 35 nm in some embodiments. The recessing of the drain feature 260(D) and filling the recess with a dielectric material (such as dielectric layers 304 and 276 in FIGS. 7B and 7C) further reduces the coupling capacitance between the drain feature 260(D) and nearby conductors such as backside power rails and backside vias. It also improves TDDB (Time Dependent Dielectric Breakdown) performance of the device 200 because the drain feature 260(D) is further away from the backside conductors. However, if the recess is too great (for example, if d5 is more than 35 nm), then the remaining portion of the drain feature 260(D) may not have sufficient volume for meeting frontside performance target in some instances. Thus, it is generally desirable to have d5 in the range of 0 nm to about 35 nm in various embodiments. In some embodiments, the operation 110 may apply more than one etching processes. For example, it may apply a first etching process to selectively remove the exposed portions of the semiconductor fins 204, and then apply a second etching process to selectively recess the S/D features 260 to a desired level, where the first and the second etching processes use different etching parameters such as using different etchants depending on the materials in the semiconductor fins 204 and the S/D features 260.

Figures 7A, 7B, 7C:
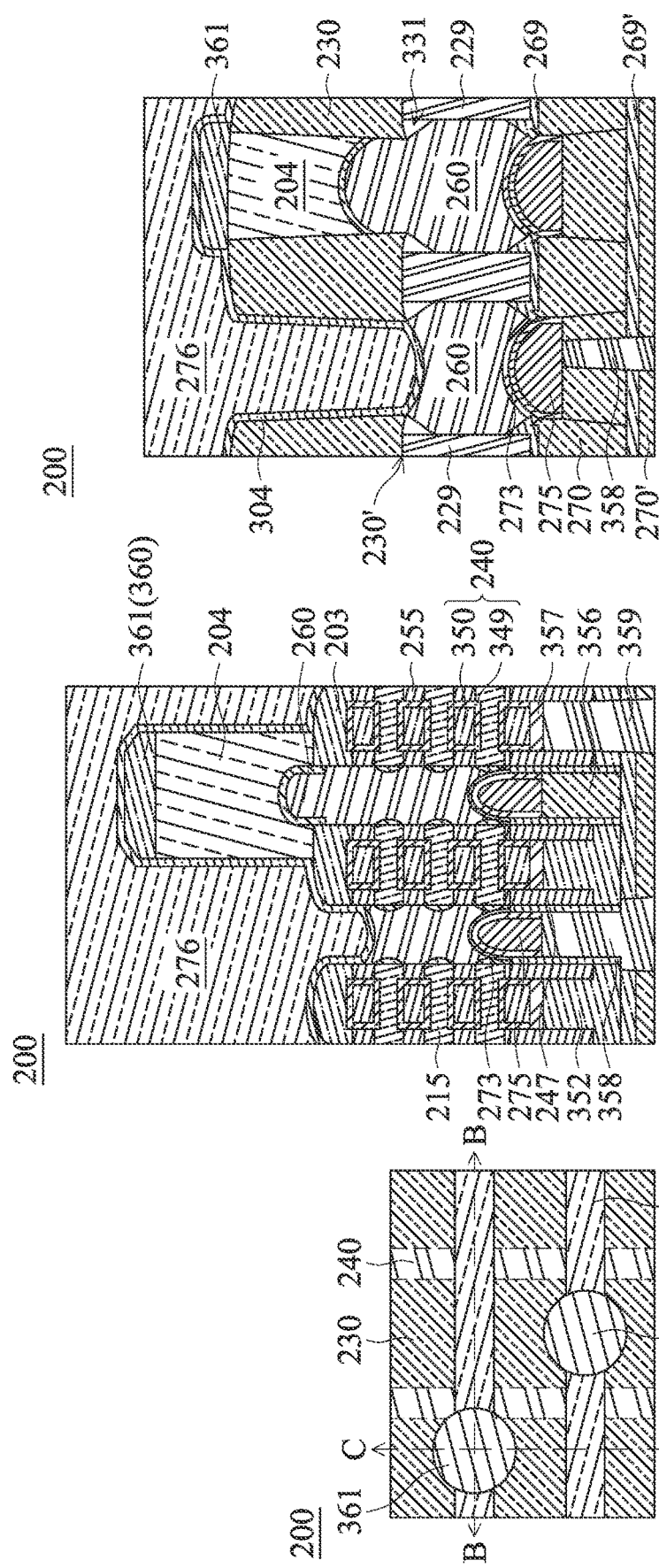

At operation 112, the method 100 (FIG. 1A) forms one or more dielectric layers filling the trenches 272, such as depicted in FIGS. 7A-7C according to an embodiment. In the present embodiment, the operation 112 deposits a dielectric liner layer 304 on the backside of the structure 200 and deposits a dielectric fill layer (or a dielectric filler) 276 over the dielectric liner layer 304 and filling the trenches 272. In an embodiment, the dielectric liner layer 304 is deposited to a substantially uniform thickness along the various surfaces of the blocking layer 203, the isolation features 230, the inner spacers 255, and any remaining portions of the hard mask pattern 361. In some embodiments, the dielectric liner layer 304 includes a dielectric material such as a dielectric material including silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the dielectric liner layer 304 may include $La_2O_3$, $Al_2O_3$, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). The dielectric liner layer 304 may be deposited using ALD, CVD, or other suitable methods. In some embodiments, the dielectric liner layer 304 is optional for the device 200 and can be omitted. In some embodiments, the thickness of the dielectric liner layer 304 may be up to 10 nm. The dielectric filler 276 may include a low-k dielectric material such as a dielectric material including Si, O, N, and C, other suitable low-k dielectric material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). The dielectric filler 276 may be deposited using CVD, FCVD, PVD, ALD, HDPCVD, MOCVD, RPCVD, PECVD, LPCVD, ALCVD, APCVD, other suitable methods, or combinations thereof. After the dielectric liner 304 and the dielectric filler 276 are deposited, operation 112 performs a CMP process to the dielectric filler 276, the dielectric liner 304, and the patterned hard mask 361 to remove them from the backside surface of the isolation features 230 and the semiconductor fins 204. Referring to FIGS. 8A-8C, the semiconductor fins 204 are exposed from the backside of the device 200 for further processing. The remaining portion of the dielectric liner 304 and the dielectric filler 276 become a dielectric feature 279 filling the trenches 272. In embodiments where the dielectric liner 304 is omitted, the dielectric feature 279 includes only the dielectric filler 276.

Figures 9A, 9B, 9C:
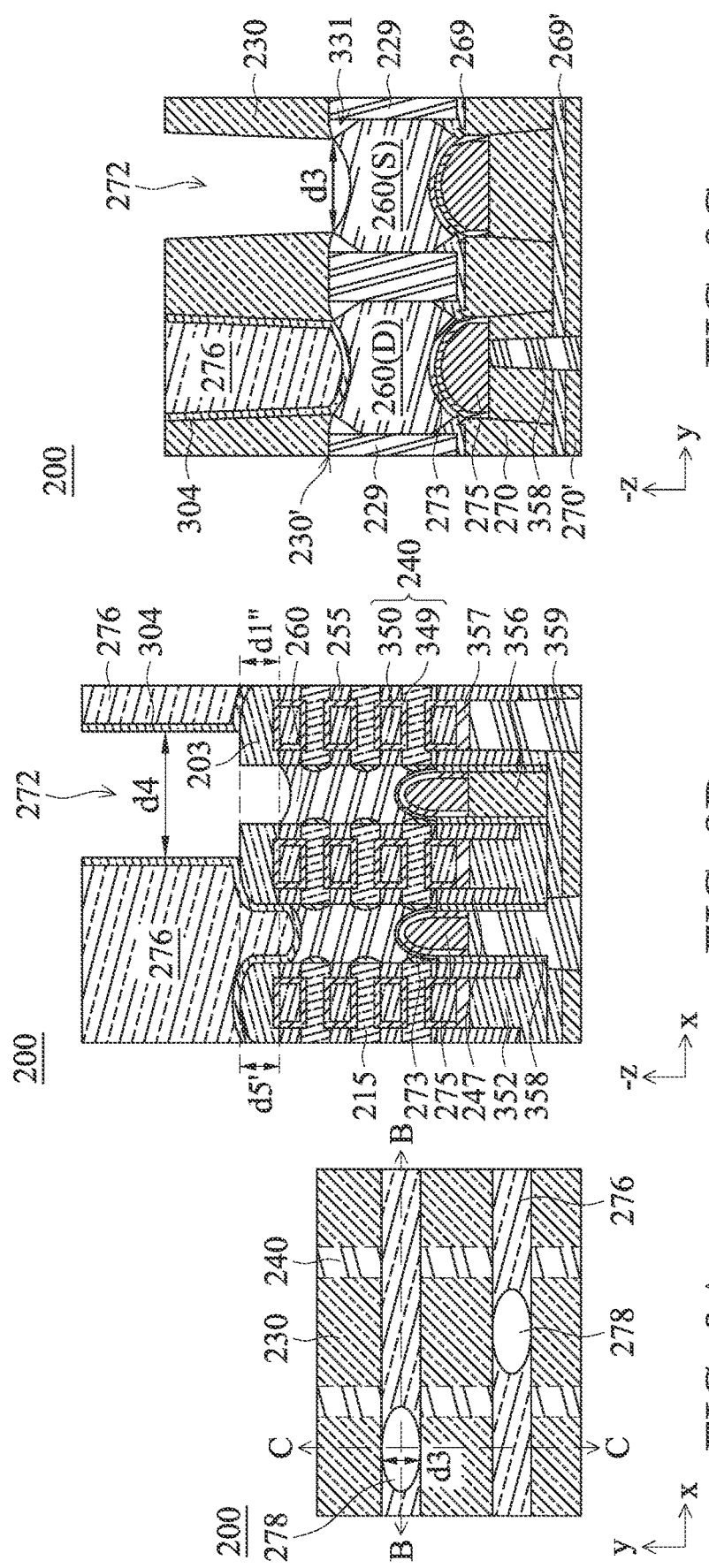

At operation 114, the method 100 (FIG. 1B) removes the semiconductor fins 204 and recesses some of the S/D features 260 (including the source feature 260(S) in the present embodiment), resulting in via holes 278. The resultant structure is shown in FIGS. 9A-9C according to an embodiment. In the depicted embodiment, a via hole 278 exposes the source feature 260(S) (specifically, the backside surface of the source feature 260(S)) from the backside of the device 200. In the "y-z" cross-sectional view (FIG. 9C), the via hole 278 may or may not expose the air gaps 331 in various embodiments.

The via hole 278 has a width d3 along the "y" direction at the top surface 230' of the isolation structure 230. The width d3 is about equal to the width d2 of the semiconductor fin 204 before etching. In other words, the width d3 is about equal to the width d2 (FIGS. 6A, 6C) of the trenches 272. The width d3 may be in a range of about 6 nm to about 40 nm in various embodiments. The via hole 278 has a width d4 along the "x" direction, which is defined by the width of the etch mask 360 (FIG. 5B) along the "x" direction. The sidewalls of the via hole 278 shown in FIG. 9B comprise the materials of the dielectric liner layer 304 in embodiments where the liner layer 304 exists and comprise the materials of the dielectric filler 276 in embodiments where the liner layer 304 does not exist. The sidewalls of the via hole 278 shown in FIG. 9c comprise the materials of the isolation structure 230.

In the present embodiment, the operation 114 applies an etching process that is tuned to be selective to the materials of the semiconductor fins 204 and with no (or minimal) etching to the isolation features 230, the dielectric liner 304 if present, the dielectric filler 276, the blocking layer 203, and the inner spacers 255. Such etching process is self-aligned (without using an etch mask) as it is confined by the isolation structure 230, the dielectric liner 304 if present, and the dielectric filler 276. In some embodiments, the operation 114 applies an isotropic etching process to remove the exposed portion of the semiconductor fin 204 with high etch selectivity with respect to the blocking layer 203 and the inner spacers 255 (i.e., the isotropic etching process is tuned to be selective to the materials of the semiconductor fins 204 and with no (or minimal) etching to the blocking layer 203 and the inner spacers 255). In such embodiments, the blocking layer 203 could be partially consumed and its thickness d1" may be slightly less than its original thickness d1 (FIG. 2B). However, its thickness d1" is greater than its thickness d1' (FIG. 6B) because the etching processes in operation 110 is anisotropic while the etching process in operation 114 is isotropic with high etch selectivity. For the same reason, the corners (or edges) of the blocking layer 203 in the via holes 278 are much less curvy (or less rounded) than the corners (or edges) of the blocking layer 203 in the trenches 272. Having the block layer 203 thicker and less curvy in the via holes 278 further reduces the coupling capacitance between the backside vias (such as the via 282 in FIG. 12B) and the gate stacks 240. In some embodiments, the operation 114 includes both an anisotropic etching process (or component) and an isotropic etching process (or component). For example, the operation 114 first applies an anisotropic etching process to etch the semiconductor fin 204 until the blocking layer 203 is exposed, then applies an isotropic etching process to remove the remaining portion of the semiconductor fin 204. The isotropic etching process is designed to minimize the loss of the blocking layer 203. In various embodiments, the blocking layer 203 and the inner spacers 255 protect the gate stacks 240 from the etching process(es) of the operation 114. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

In the depicted embodiment, the source feature 260(S) is also partially recessed to a level that is even with or slightly below the top surface 230' of the isolation structure 230. In various embodiments, the source feature 260(S) is recessed such that its bottom (or backside) surface is below the bottom (or backside) surface of the blocking layer 203 by a distance d5' when the device 200 is viewed upside down such as in FIG. 9B. The distance d5' may be in a range of 0 nm to about 35 nm in various embodiments. In some embodiments, the source feature 260(S) includes multiple layers of semiconductor materials with different dopant concentrations. Particularly, the bottommost layer (i.e., the outermost layer at the backside of the source feature 260(S)) includes a lower dopant concentration than another layer below it (i.e., towards the frontside). When forming backside silicide and via structures on the source feature 260(S), it is generally desirable to form such silicide and via structure on the more highly doped layer(s) of the source feature 260(S) to reduce contact resistance. Therefore, recessing the source feature 260(S) to expose more highly doped layer(s) is generally desirable and beneficial. If the recess is too shallow (for example, d5' is less than 0 nm), the silicide and via structures might be formed on a less doped layer of the source feature 260(S) and the contact resistance might suffer in some instances. If the recess is too deep (for example, d5' is more than 35 nm), the remaining portion of the source feature 260(S) might not have sufficient volume for meeting frontside performance target in some instances. Thus, it is generally desirable to have d5' in the range of 0 nm to about 35 nm in various embodiments. Further, the depth d5' and the depth d5 (FIG. 6B) may be about the same in some embodiments or are different in alternative embodiments. In some embodiments, the operation 114 may apply more than one etching processes. For example, it may apply a first etching process to selectively remove the exposed portions of the semiconductor fins 204, and then apply a second etching process to selectively recess the S/D features 260 to a desired level, where the first and the second etching processes use different etching parameters such as using different etchants depending on the materials in the semiconductor fins 204 and the S/D features 260.

Figures 10A, 10B, 10C:
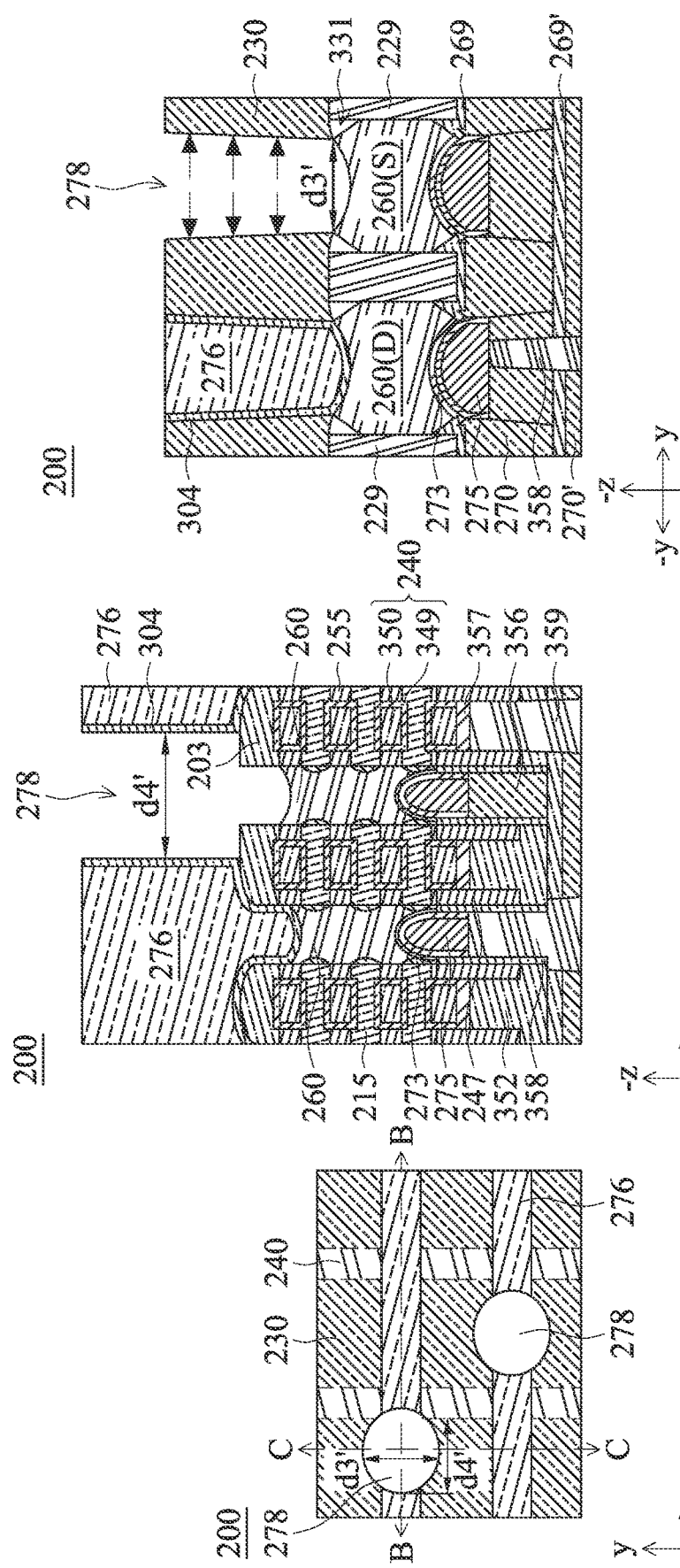

At operation 116, the method 100 (FIG. 1B) laterally etch the sidewalls of the via hole 278 to expand it (at least) along the "y" direction, such as shown in FIGS. 10A-10C. As discussed above, the width d3 of the via hole 278 is about the same as the width of the semiconductor fins 204 before the operation 116 is performed. In highly integrated devices, the width of the semiconductor fins 204 are becoming smaller and smaller. In some instances, the width d3 (and the width d2 as well) is about only 8 nm or less. At the same time, the isolation structure 230 is relatively thick. Therefore, the via hole 278 (and the via 282 formed therein, see FIGS. 12B, 12C) could be narrow and tall. Particularly, compared with the frontside S/D contact 275, the backside via 282 might be only about one fourth to one tenth as wide as the S/D contact 275, yet about twice or four times taller than the S/D contact 275. This leads to a higher S/D resistance at the backside of the device 200 than at the frontside of the device 200. In some implementations, a 40% more S/D resistance has been observed at the backside of the device 200 than at the frontside of the device 200. An object of the present disclosure is to expand the via hole 278 (and the via 282 formed therein) to surpass the boundaries set by the semiconductor fin 204, thereby reducing the S/D resistance at the backside of the device 200.

In the present embodiment, operation 116 laterally etches the sidewalls of the via hole 278 to expand it at least along the "y" direction. In some embodiments, operation 116 applies an anisotropic etching that is tuned selective to the materials of the isolation structure 230, thereby expanding the via hole 278 along the "y" direction. In embodiments where the isolation structure 230 includes silicon dioxide, the anisotropic etching of the operation 116 may apply $NF_3$, $NH_3$, HF, other etchants or chemicals, or a combination thereof. The etching is a dry etching in the present embodiments. In various embodiments, the operation 116 may expand the width of the via hole 278 from d3 (before etching) to d3' (after etching) along the "y" direction. For example, the width d3' may be greater than the width d3 by 10% to 40%. For example, the width d3' may be greater than the width d3 by about 2 nm to about 10 nm per side with respect to the center line going through the via hole 278 along the "x" direction. In such embodiments, the total width expansion of the via hole 278 along the "y" direction amounts to about 4 nm to about 20 nm. Because the width d3 is about equal to width d2 (both are widths of semiconductor fins 204), the via hole 278 effectively has a width d3' that is greater than the width d2 of the trench 272 by about 10% to 40%, by about 2 nm to about 10 nm per side with respect to their respective centerlines, or by about 4 nm to about 20 nm, in various embodiments. In embodiments, the operation 116 may control the amount of expansion (i.e., d3'-d3) by controlling the number of etching cycles, the amount of etchants applied, or other etching parameters. The expansion of the via hole 278 leads to a wider interface between backside silicide/via and the source feature 260(S), a larger volume of the backside via, and lower S/D resistance.

In embodiments where the dielectric liner 304 exists on the sidewalls of the via hole 278 and includes a different material than the isolation structure 230 (for example, the dielectric liner 304 includes silicon nitride and the isolation structure 230 includes silicon dioxide), the etching of the operation 116 may be tuned selective to the isolation structure 230 and with no (or minimal) etching to the dielectric liner 304. In such embodiments, the width d4' of the via hole 278 along the "x" direction remains about the same as the width d4 (FIG. 9B) before etching, which is confined by the combination of the dielectric liner 304 and the dielectric filler 276. In embodiments where the dielectric liner 304 does not exist and the dielectric filler 276 is exposed on the sidewalls of the via hole 278 and includes a same or similar material as the isolation structure 230, the operation 116 etches both the isolation structure 230 and the dielectric filler 276. In such embodiments, the width d4' of the via hole 278 along the "x" direction becomes greater than the width d4 (FIG. 9B) before etching. In such embodiments, the width d4' may become greater than the width d4 by about 10% to about 40%, by about 2 nm to about 10 nm per side with respect to the centerline going through the via hole 278 along the "y" direction, or by about 4 nm to about 20 nm total. The expansion of the via hole 278 along the "x" direction further increase the volume of the via 282 (FIG. 12B) and further reduces S/D resistance.

During the etching of the isolation structure 230 as discussed above, the operation 116 may also partially recess the dielectric filler 276 depending on whether the materials of the isolation structure 230 and the dielectric filler 276 are similar and how selective the etchant is. The dielectric filler 276 may be initially designed thick enough to take into account the potential loss during this fabrication step.

Still further, the operation 116 also cleans the surfaces of the source feature 260(S) for subsequent silicide formation by removing any oxidation or contaminants from the surfaces of the source feature 260(S). In some embodiments, such cleaning also expands the surface area of the source feature 260(S) for larger silicide and lower S/D contact resistance. In some embodiment, the operation 116 includes both an anisotropic etching process (or component) and an isotropic etching process (or component). For example, the anisotropic etching process may be primarily used for cleaning the surfaces of the source feature 260(S) while the isotropic etching is primarily used for expanding the widths of the via hole 278 and expanding the interfacial area of the source feature 260(S). In some embodiments, isotropic etching process may be used for both expanding the widths of the via hole 278 and for cleaning the surfaces of the source feature 260(S). In some embodiments, the operation 116 may expose the air gaps 331 (i.e., connecting the via hole 278 and the air gap 331) when the expansion of the via hole 278 along the "y" direction is big enough.

Figures 11A, 11B, 11C:
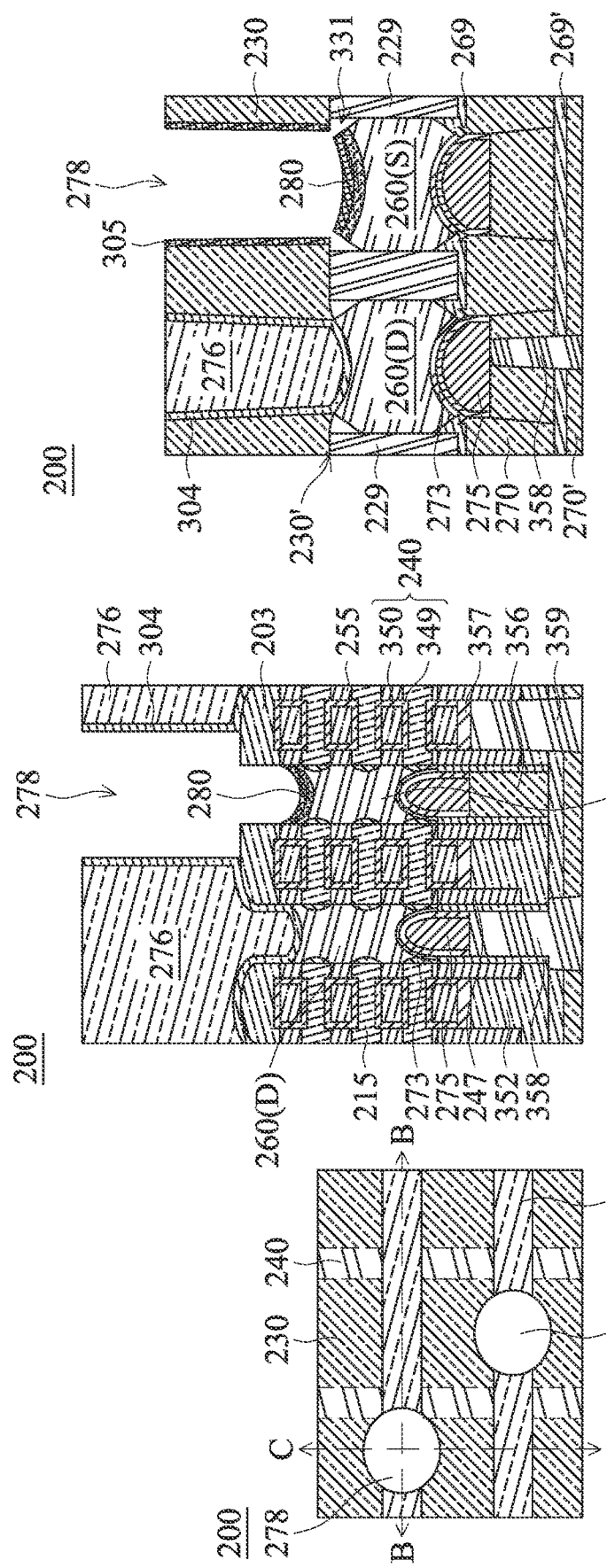
Figures 1, 11C:
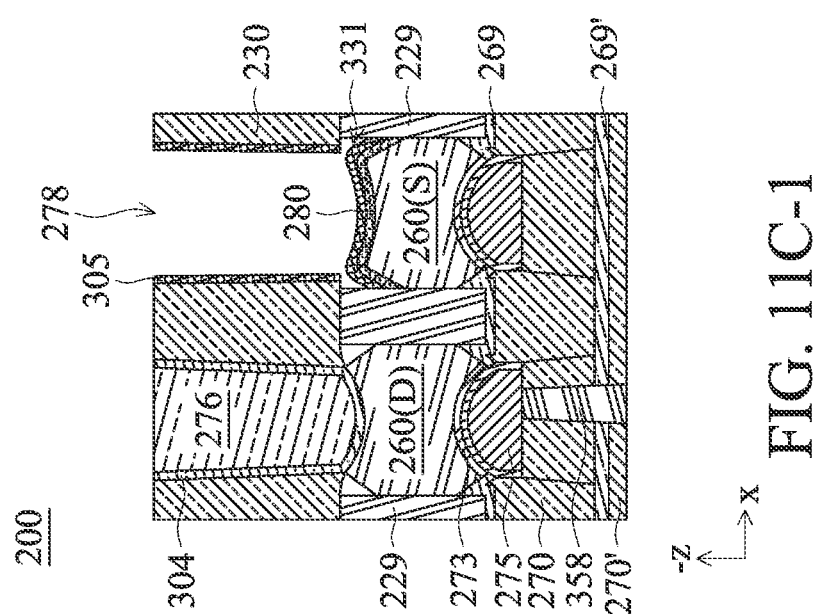

At operation 118, the method 100 (FIG. 1B) forms a silicide feature 280 in the via hole 278, such as shown in FIGS. 11A-11C. In an embodiment, the operation 118 includes depositing one or more metals into the via hole 278 (which may nor may not fill into the voids 331), performing an annealing process to the device 200 to cause reaction between the one or more metals and the source feature 260(S) to produce the silicide feature 280, and removing un-reacted portions of the one or more metals, leaving the silicide feature 280 in the via hole 278. The one or more metals may include titanium (Ti), tantalum (Ta), tungsten (W), nickel (Ni), platinum (Pt), ytterbium (Yb), iridium (Ir), erbium (Er), cobalt (Co), other noble metals, other refractory metals, rare earth metals, or their alloys, and may be deposited using CVD, PVD, ALD, or other suitable methods. The silicide feature 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. A layer 305 of a metal nitride or a metal oxide may form on the sidewalls of the via hole 278 shown in FIG. 11C by reacting with oxygen or nitrogen element(s) on the sidewalls. For example, the layer 305 may include titanium nitride when the silicide feature 280 includes titanium silicide. In some embodiments, the silicide feature 280 may have a thickness in a range of about 1 nm to about 10 nm, for example. Depending on the size of the opening of the gap 331 exposed by the via hole 278, the silicide feature 280 may or may not form inside the gap 331. In some embodiments, the opening is too small for metals to fill into the gap 331, and the silicide feature 280 does not form inside the gap 331, such as shown in FIG. 11C. In some embodiments, the opening is large enough for metals to fill (partially or completely) into the gap 331, and the silicide feature 280 does form inside the gap 331, such as shown in FIG. 11C-1. The embodiment depicted in FIG. 11C-1 further increase the area of the silicide feature 280 for reduced S/D contact resistance.

Figures 12A, 12B, 12C:
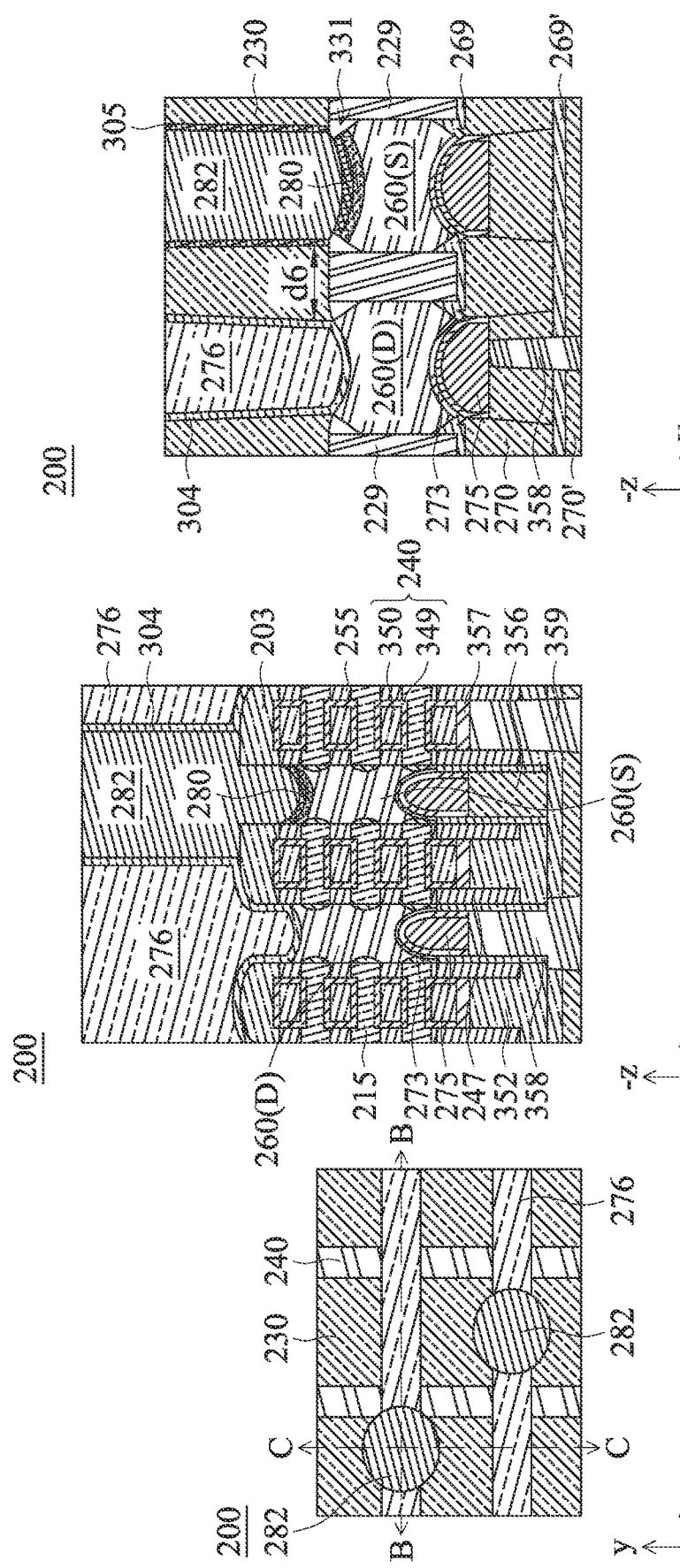

At operation 120, the method 100 (FIG. 1B) forms a via structure (or a via) 282 in the via hole 278 and over the silicide feature 280, such as shown in FIGS. 12A-12C. In some embodiments, depending on the size of the opening of the gap 331 exposed in the via hole 278 and the filling capability of the metal(s) for the via 282, the via 282 may or may not fill into the gap 331. In the embodiment depicted in FIG. 12C, the via 282 does not fill into the gap 331, leaving the air gap 331 trapped by the isolation feature 230, the dielectric fins 229, the S/D feature 260, the silicide feature 280, and the via 282. The air gap 331 somewhat reduces the coupling capacitance between the via 282 and the nearby conductors such as metal gates 240 at the expense of reduced contact area between the via 282 and the S/D feature 260. In the embodiment depicted in FIG. 12C-1, the via 282 partially fills into the gap 331, leaving a portion of the air gap 331 trapped by the isolation feature 230, the dielectric fins 229, the S/D feature 260, the silicide feature 280, and the via 282. In the embodiment depicted in FIG. 12C-2, the via 282 completely fills into the gap 331 and in direct contact with the dielectric fins 229. The embodiment depicted in FIG. 12C-2 further increases the contact area between the via 282 and the S/D feature 260. In embodiments, the via 282 may include tungsten (W), cobalt (Co), molybdenum (Mo), ruthenium (Ru), copper (Cu), nickel (Ni), titanium (Ti), tantalum (Ta), aluminum (Al), titanium nitride (TiN), tantalum nitride (TaN), or other metals, and may be formed by CVD, PVD, ALD, plating, or other suitable processes. The operation 120 may perform a CMP process to remove excessive materials of the via 282 after deposition. Due to the operation 116 as discussed above, the via 282 have a large volume for reduced resistance. In some embodiments, the via 282 may have a height up to about 60 nm for example.

It is noted that the sidewalls of the via hole 278 are free of a dielectric liner (such as a silicon nitride liner) between the via structure 282 and the isolation structure 230 (i.e., in the cross-section of FIG. 11C). This further increases the width the via structure 282 along the "x" direction and the "y" direction compared to approaches where a dielectric liner is implemented. A dielectric liner typically has a thickness of 0.5 nm to about 2.5 nm. Thus, having no such dielectric liner further increases the width of the via structure 282 about 1 nm to about 5 nm along both the "x" direction and the "y" direction. The distance d6 from the edge of the via 282 to the dielectric liner 304 (FIG. 12C) may be in a range of about 20 nm to about 40 nm in various embodiments. If the distance d6 is too small (such as less than 20 nm), the coupling capacitance between the source feature 260(S) and the drain feature 260(D) may be too high for some implementations. If the distance d6 is too big (such as more than 40 nm), the device integration density would suffer for some implementations.

Figures 13A, 13B, 13C:
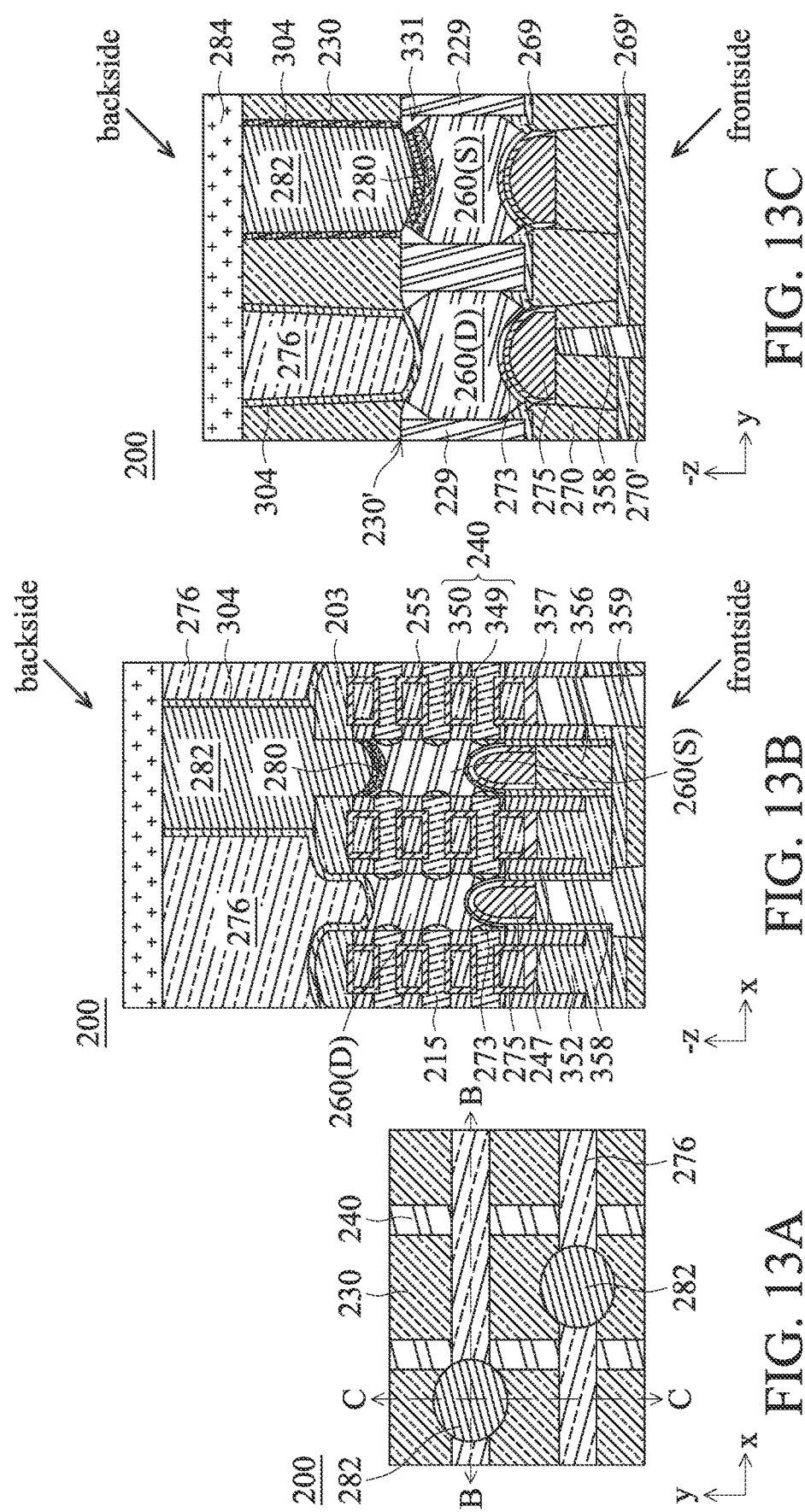

At operation 122, the method 100 (FIG. 1B) forms one or more backside power rails 284. The resultant structure is shown in FIGS. 13A-13C according to an embodiment. As illustrated in FIGS. 13B-13C, the backside via 282 is electrically connected to the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Although not shown in FIGS. 13A-13C, the backside power rails 284 are embedded in one or more dielectric layers. Having backside power rails 284 beneficially increases the number of metal tracks available in the device 200 for directly connecting to source/drain contacts and vias. It also increases the gate density for greater device integration than other structures without the backside power rails 284. The backside power rails 284 may have wider dimension than the first level metal (M0) tracks on the frontside of the device 200, which beneficially reduces the backside power rail resistance.

At operation 124, the method 100 (FIG. 1B) performs further fabrication processes to the device 200. For example, it may form one or more interconnect layers 286 on the backside of the structure 200 such as shown in FIGS. 14A-14C, form passivation layers on the backside of the device 200, perform other BEOL processes, and remove the carrier 370. In some embodiments, the power rail 284 is considered part of the backside interconnect 286.

In the above discussion, the drain side (drain feature 260(D)) is processed (operations 110, 112) before the source side (source feature 260(S)) is processed (operations 114, 116, 118, 120). In an alternative embodiment of the method 100, the order of operations may be modified to process the source side before processing the drain side. For example, the etch mask 360 is formed to cover the drain side and to expose the source side (i.e., a variation of operation 108), then the source side is etched to remove the exposed portions of the semiconductor fins 204 (operation 114) to form the via holes 278, remove the etch mask 360, laterally expand the via holes 278 (operation 116), and form silicide features 280 and the vias 282 in the via holes 278 (operations 118 and 120). Then, the drain side is etched (using a self-aligned etching method) to remove the remaining portions of the semiconductor fins 204 (operation 110) to form the trenches 272, deposit the dielectric layers 304 and 276 into the trenches 272 (operation 112), and perform a CMP process. Similar effects and structures are achieved by this alternative embodiment as those discussed above.

Although not intended to be limiting, embodiments of the present disclosure provide one or more of the following advantages. For example, embodiments of the present disclosure use lateral etching to expand the dimension of backside via holes and backside vias. This extends the dimension of backside via holes past the limits set by frontside semiconductor fins and advantageously reduces the backside contact resistance, for example, by 10% to 40% in some implementations. Embodiments of the present disclosure can be readily integrated into existing semiconductor manufacturing processes.

In one example aspect, the present disclosure is directed to a method that includes providing a structure including a fin oriented lengthwise along a first direction and widthwise along a second direction perpendicular to the first direction, an isolation structure adjacent to sidewalls of the fin, and first and second source/drain (S/D) features over the fin. The method further includes forming an etch mask exposing a first portion of the fin under the first S/D feature and covering a second portion of the fin under the second S/D feature; removing the first portion of the fin through the etch mask, resulting in a first trench; forming a first dielectric feature in the first trench; and removing the second portion of the fin to form a second trench. The first dielectric feature forms first sidewalls of the second trench and the isolation structure forms second sidewalls of the second trench. The method further includes laterally etching the second sidewalls of the second trench, thereby expanding the second trench along the second direction; and after the laterally etching, forming a via structure in the second trench.

In some embodiments, after the forming of the first dielectric feature, the method further includes removing the etch mask before the removing of the second portion of the fin. In some embodiments, the laterally etching is tuned selective to a material of the isolation structure and not a material of the first dielectric feature. In some embodiments, the laterally etching widens a width of the second trench by about 10% to about 40% as measured at a top surface of the isolation structure and along the second direction. In some embodiments, the laterally etching exposes a void partially surrounded by the isolation structure, the second S/D feature, and a dielectric fin adjoining the second S/D feature. In some further embodiments, the via structure fills the void.

In some embodiments of the method, the laterally etching further cleans surfaces of the second S/D feature exposed in the second trench. In some embodiments, the laterally etching includes an isotropic etching component and an anisotropic etching component. In some embodiments, the second S/D feature is a source feature of a transistor.

In another example aspect, the present disclosure is directed to a method that includes providing a structure including a substrate, a fin over the substrate, an isolation structure over the substrate and adjacent to sidewalls of the fin, and first and second source/drain (S/D) features over the fin. The method further includes thinning down the substrate until the fin is exposed; forming an etch mask exposing a first portion of the fin under the first S/D feature and covering a second portion of the fin under the second S/D feature; removing the first portion of the fin through the etch mask, resulting in a first trench; forming a first dielectric feature in the first trench; and removing the second portion of the fin, resulting in a second trench, wherein the first dielectric feature forms first sidewalls of the second trench, the isolation structure forms second sidewalls of the second trench, and the first and the second sidewalls of the second trench include different materials. The method further includes laterally etching the second sidewalls of the second trench, wherein the laterally etching is tuned selective to a material of the second sidewalls of the second trench but not a material of the first sidewalls of the second trench. After the laterally etching, the method further includes forming a silicide feature on surfaces of the second S/D feature exposed in the second trench.

In some embodiments of the method, the removing of the first portion of the fin includes applying an anisotropic etching process to the first portion of the fin, and the removing of the second portion of the fin includes applying an isotropic etching process to the second portion of the fin. In some embodiments, the laterally etching includes both an isotropic etching process and an anisotropic etching process.

In some embodiments of the method, the isolation structure includes silicon dioxide, and the laterally etching includes applying at least one of $NF_3$, $NH_3$, and HF. In some embodiments, the method further includes forming a via structure in the second trench and over the silicide feature.

In some embodiments of the method, the laterally etching widens a width of the second trench by about 10% to about 40% as measured at a top surface of the isolation structure and along a widthwise direction of the fin. In some embodiments, the laterally etching widens a width of the second trench by about 2 nm to about 10 nm per side as measured at a top surface of the isolation structure and along a widthwise direction of the fin.

In yet another example aspect, the present disclosure is directed to a semiconductor structure that includes a power rail; an isolation structure over the power rail; first and second source/drain (S/D) features over the isolation structure, defining a first direction from the first S/D feature to the second S/D feature; one or more channel layers over the isolation structure and connecting the first and the second S/D features; a first via structure extending through the isolation structure and electrically connecting the first S/D feature and the power rail; and a first dielectric feature extending through the isolation structure and physically contacting the second S/D feature and the power rail. The first via structure has a first width in a first cross-section perpendicular to the first direction, the first dielectric feature has a second width in a second cross-section parallel to the first cross-section, and the first width is greater than the second width.

In some embodiments of the semiconductor structure, the first width is greater than the second width by about 10% to about 40%. In some embodiments, the first width is greater than the second width by about 4 nm to about 20 nm. In some embodiments, an outermost layer of the first dielectric feature is a portion of a silicon nitride liner, and the via structure adjoins the isolation structure in the first cross-section and adjoins the silicon nitride liner in a third cross-section along the first direction.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a structure including a fin oriented lengthwise along a first direction and widthwise along a second direction perpendicular to the first direction, an isolation structure adjacent to sidewalls of the fin, and first and second source/drain (S/D) features over the fin;
   forming an etch mask exposing a first portion of the fin under the first S/D feature and covering a second portion of the fin under the second S/D feature;
   removing the first portion of the fin through the etch mask, resulting in a first trench;
   forming a first dielectric feature in the first trench;
   removing the second portion of the fin to form a second trench, wherein the first dielectric feature forms first sidewalls of the second trench and the isolation structure forms second sidewalls of the second trench;

laterally etching the second sidewalls of the second trench, thereby expanding the second trench along the second direction; and after the laterally etching, forming a via structure in the second trench.

2. The method of claim 1, after the forming of the first dielectric feature, further comprising:

removing the etch mask before the removing of the second portion of the fin.

3. The method of claim 1, wherein the laterally etching is tuned selective to a material of the isolation structure and not a material of the first dielectric feature.

4. The method of claim 1, wherein the laterally etching widens a width of the second trench by about 10% to about 40% as measured at a top surface of the isolation structure and along the second direction.

5. The method of claim 1, wherein the laterally etching exposes a void partially surrounded by the isolation structure, the second S/D feature, and a dielectric fin adjoining the second S/D feature.

6. The method of claim 5, wherein the via structure fills the void.

7. The method of claim 1, wherein the laterally etching further cleans surfaces of the second S/D feature exposed in the second trench.

8. The method of claim 1, wherein the laterally etching includes an isotropic etching component and an anisotropic etching component.

9. The method of claim 1, wherein the second S/D feature is a source feature of a transistor.

10. A method, comprising:

providing a structure including a substrate, a fin over the substrate, an isolation structure over the substrate and adjacent to sidewalls of the fin, and first and second source/drain (S/D) features over the fin;

thinning down the substrate until the fin is exposed;

forming an etch mask exposing a first portion of the fin under the first S/D feature and covering a second portion of the fin under the second S/D feature;

removing the first portion of the fin through the etch mask, resulting in a first trench;

forming a first dielectric feature in the first trench;

removing the second portion of the fin, resulting in a second trench, wherein the first dielectric feature forms first sidewalls of the second trench, the isolation structure forms second sidewalls of the second trench, and the first and the second sidewalls of the second trench include different materials;

laterally etching the second sidewalls of the second trench, wherein the laterally etching is tuned selective to a material of the second sidewalls of the second trench but not a material of the first sidewalls of the second trench; and after the laterally etching, forming a silicide feature on surfaces of the second S/D feature exposed in the second trench.

11. The method of claim 10, wherein the removing of the first portion of the fin includes applying an anisotropic etching process to the first portion of the fin, and the removing of the second portion of the fin includes applying an isotropic etching process to the second portion of the fin.

12. The method of claim 10, wherein the laterally etching includes both an isotropic etching process and an anisotropic etching process.

13. The method of claim 10, wherein the isolation structure includes silicon dioxide, and the laterally etching includes applying at least one of $NF_3$, $NH_3$, and HF.

14. The method of claim 10, further comprising:

forming a via structure in the second trench and over the silicide feature.

15. The method of claim 10, wherein the laterally etching widens a width of the second trench by about 10% to about 40% as measured at a top surface of the isolation structure and along a widthwise direction of the fin.

16. The method of claim 10, wherein the laterally etching widens a width of the second trench by about 2 nm to about 10 nm per side as measured at a top surface of the isolation structure and along a widthwise direction of the fin.

17. A method, comprising:

providing a structure including an isolation structure, a semiconductor fin extending in the isolation structure and oriented lengthwise along a first direction and widthwise along a second direction perpendicular to the first direction, and one or more source/drain (S/D) features below the semiconductor fin;

forming an etch mask over the semiconductor fin, wherein the etch mask exposes a first portion of the semiconductor fin and covers a second portion of the semiconductor fin;

etching the first portion of the semiconductor fin through the etch mask, resulting in a first trench;

forming one or more first dielectric layers in the first trench;

etching the second portion of the semiconductor fin without using another etch mask, thereby forming a second trench; and laterally etching sidewalls of the second trench, thereby expanding the second trench along the second direction.

18. The method of claim 17, wherein the one or more first dielectric layers form first sidewalls of the second trench, the isolation structure forms second sidewalls of the second trench, and the laterally etching is tuned selective to a material of the second sidewalls of the second trench.

19. The method of claim 18, wherein the laterally etching includes an isotropic etching component and an anisotropic etching component.

20. The method of claim 17, wherein the etching of the second portion of the semiconductor fin includes applying an isotropic etching process to the second portion of the semiconductor fin.

* * * * *